United States Patent
Harada et al.

(10) Patent No.: US 11,715,535 B2
(45) Date of Patent: Aug. 1, 2023

(54) SEMICONDUCTOR STORAGE DEVICE

(71) Applicant: KIOXIA CORPORATION, Tokyo (JP)

(72) Inventors: Yoshikazu Harada, Kawasaki Kanagawa (JP); Yuji Nagai, Sagamihara Kanagawa (JP); Kenro Kikuchi, Fujisawa Kanagawa (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/181,660

(22) Filed: Feb. 22, 2021

(65) Prior Publication Data

US 2021/0335433 A1 Oct. 28, 2021

(30) Foreign Application Priority Data

Apr. 24, 2020 (JP) ................ 2020-077416

(51) Int. Cl.
| | |
|---|---|
| *G11C 16/04* | (2006.01) |
| *G11C 16/34* | (2006.01) |
| *G11C 16/10* | (2006.01) |
| *G11C 7/04* | (2006.01) |
| *G11C 16/08* | (2006.01) |
| *G11C 16/30* | (2006.01) |
| *G11C 16/26* | (2006.01) |

(52) U.S. Cl.
CPC ............ *G11C 16/3459* (2013.01); *G11C 7/04* (2013.01); *G11C 16/08* (2013.01); *G11C 16/10* (2013.01); *G11C 16/26* (2013.01); *G11C 16/30* (2013.01)

(58) Field of Classification Search
CPC ...... G11C 16/10; G11C 11/5628; G11C 16/26; G11C 16/3459
See application file for complete search history.

(56) References Cited

U.S. PATENT DOCUMENTS

| | | | |
|---|---|---|---|
| 2016/0027522 A1 | 1/2016 | Hung et al. | |
| 2016/0313946 A1* | 10/2016 | Zang | G06F 3/0611 |
| 2017/0041486 A1 | 2/2017 | Noda et al. | |
| 2018/0151237 A1* | 5/2018 | Lee | G11C 16/16 |
| 2018/0197610 A1* | 7/2018 | Lee | G11C 16/0483 |
| 2018/0247695 A1* | 8/2018 | Kasai | G11C 16/0483 |
| 2019/0088342 A1* | 3/2019 | Shimura | G11C 16/16 |
| 2019/0171360 A1* | 6/2019 | Lee | G06F 3/0646 |
| 2019/0392910 A1 | 12/2019 | Lee et al. | |
| 2020/0350029 A1* | 11/2020 | Kim | G11C 16/10 |

FOREIGN PATENT DOCUMENTS

JP 2017-034599 A 2/2017

* cited by examiner

*Primary Examiner* — Uyen Smet
(74) *Attorney, Agent, or Firm* — Kim & Stewart LLP

(57) ABSTRACT

A semiconductor storage device includes a memory cell connected to a word line, and a control circuit configured to execute a write operation that repeats a program loop including a program operation of applying a program voltage to the word line and a verification operation to be executed after the program operation. The control circuit, during the write operation, increases the program voltage by a first amount each time the program loop is repeated, and after the write operation is interrupted and resumed, changes the increase in the program voltage from the first amount to a second amount, which is a positive number smaller than the first amount.

17 Claims, 19 Drawing Sheets

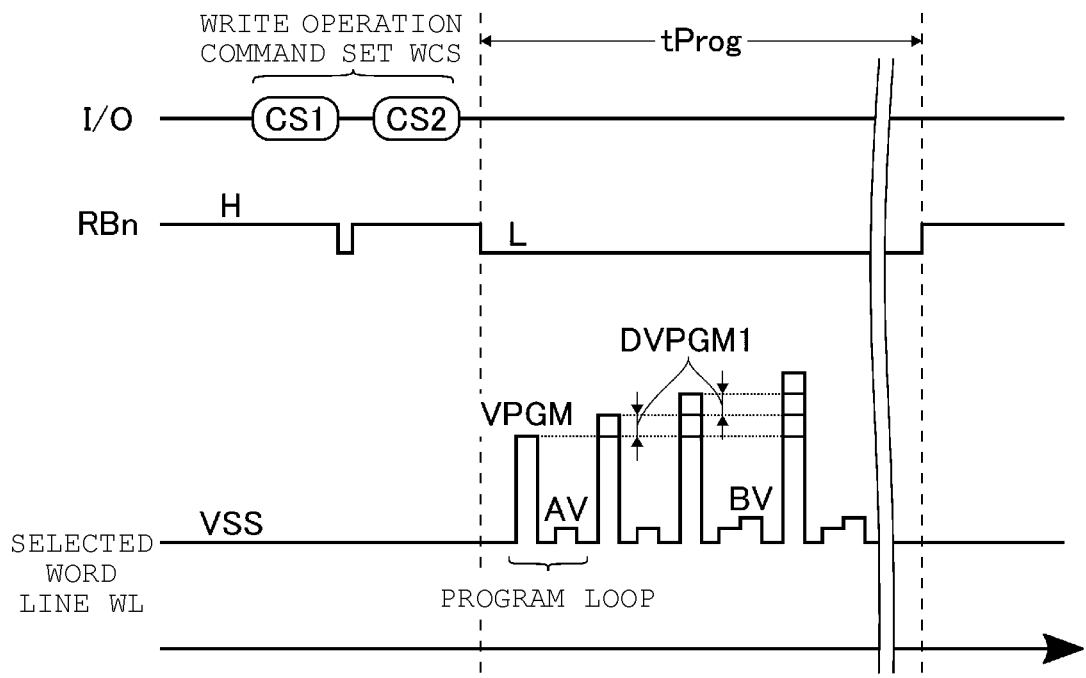
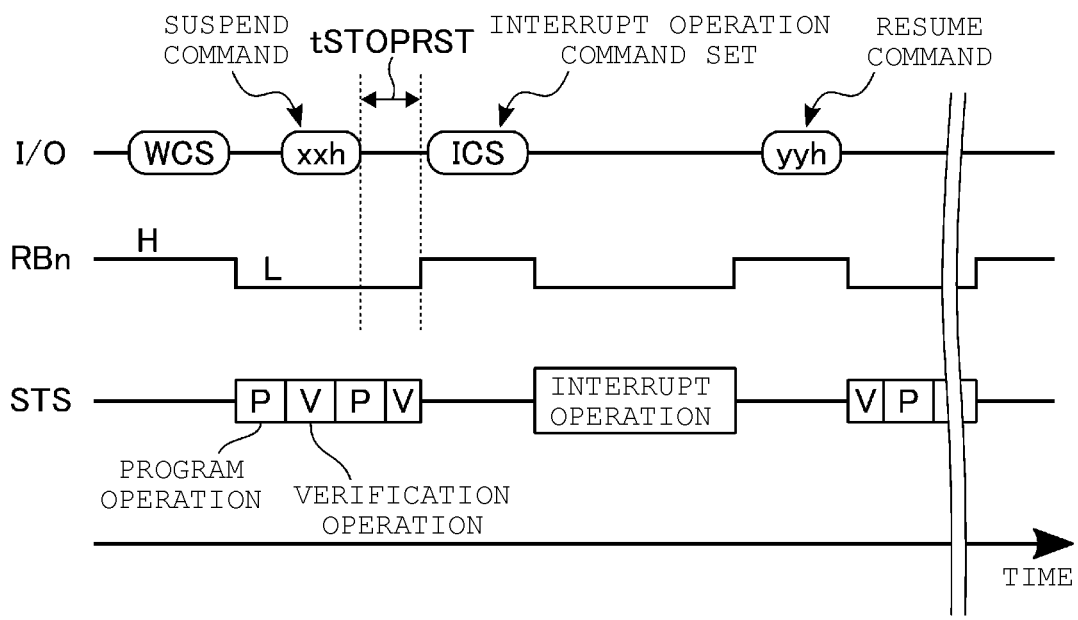

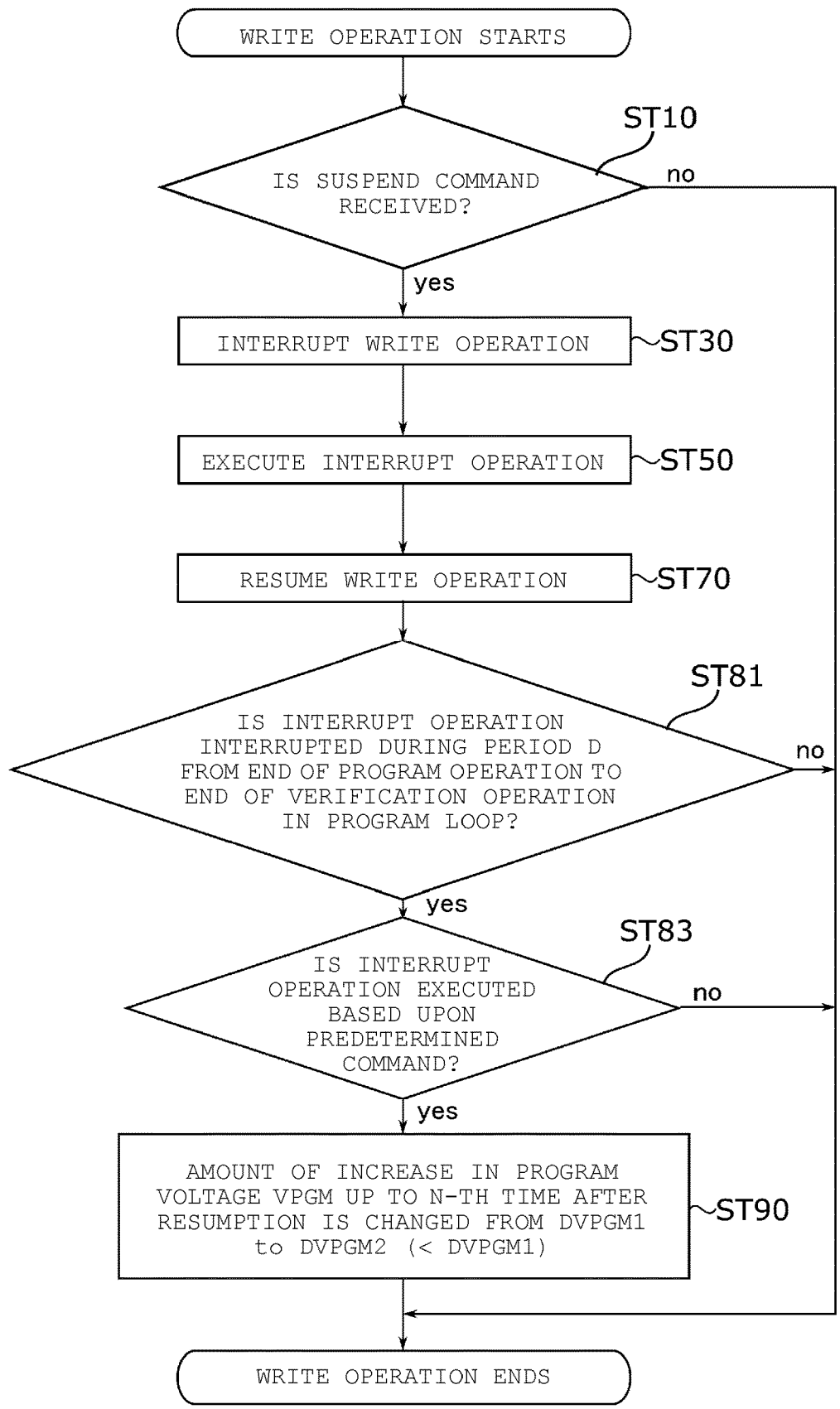

SEMICONDUCTOR STORAGE DEVICE

CROSS-REFERENCE TO RELATED APPLICATION

This application is based upon and claims the benefit of priority from Japanese Patent Application No. 2020-077416, filed Apr. 24, 2020, the entire contents of which are incorporated herein by reference.

FIELD

Embodiments described herein relate generally to a semiconductor storage device.

BACKGROUND

A NAND type flash memory is a semiconductor storage device that is capable of storing data in a non-volatile manner.

DESCRIPTION OF THE DRAWINGS

FIG. 4 is a command sequence and a timing chart illustrating a write operation in the memory system according to the first embodiment.

FIG. 5 is a command sequence and a timing chart illustrating an interrupt operation in the memory system according to the first embodiment.

FIG. 15 is a flowchart illustrating a write operation that is interrupted, in a memory system according to a third example of the second embodiment.

DETAILED DESCRIPTION

An interrupt operation is executed in a way that reduces deterioration in performance of a write operation.

In general, according to one embodiment, a semiconductor storage device includes a memory cell connected to a word line, and a control circuit configured to execute a write operation that repeats a program loop including a program operation of applying a program voltage to the word line and a verification operation to be executed after the program operation. The control circuit, during the write operation, increases the program voltage by a first amount each time the program loop is repeated, and after the write operation is interrupted and resumed, changes the increase in the program voltage from the first amount to a second amount, which is a positive number smaller than the first amount.

Hereinafter, embodiments will be described with reference to the drawings. In the following description, a component having the same function and configuration will be denoted by a common reference sign. When distinguishing a plurality of components having the common reference sign, a suffix is added to the common reference sign to distinguish the plurality of components. When it is not particularly necessary to distinguish a plurality of components, only the common reference sign is added to the plurality of components, and no suffix is added thereto.

1. First Embodiment

A first embodiment will be described. Hereinafter, a NAND flash memory as a non-volatile memory and a memory system including the NAND flash memory will be described as an example.

1.1 Configuration

A configuration of the memory system according to the first embodiment will be described.

1.1.1 Memory System

First, an outline of the configuration including the memory system according to the first embodiment will be described with reference to FIG. 1.

Figure 1:
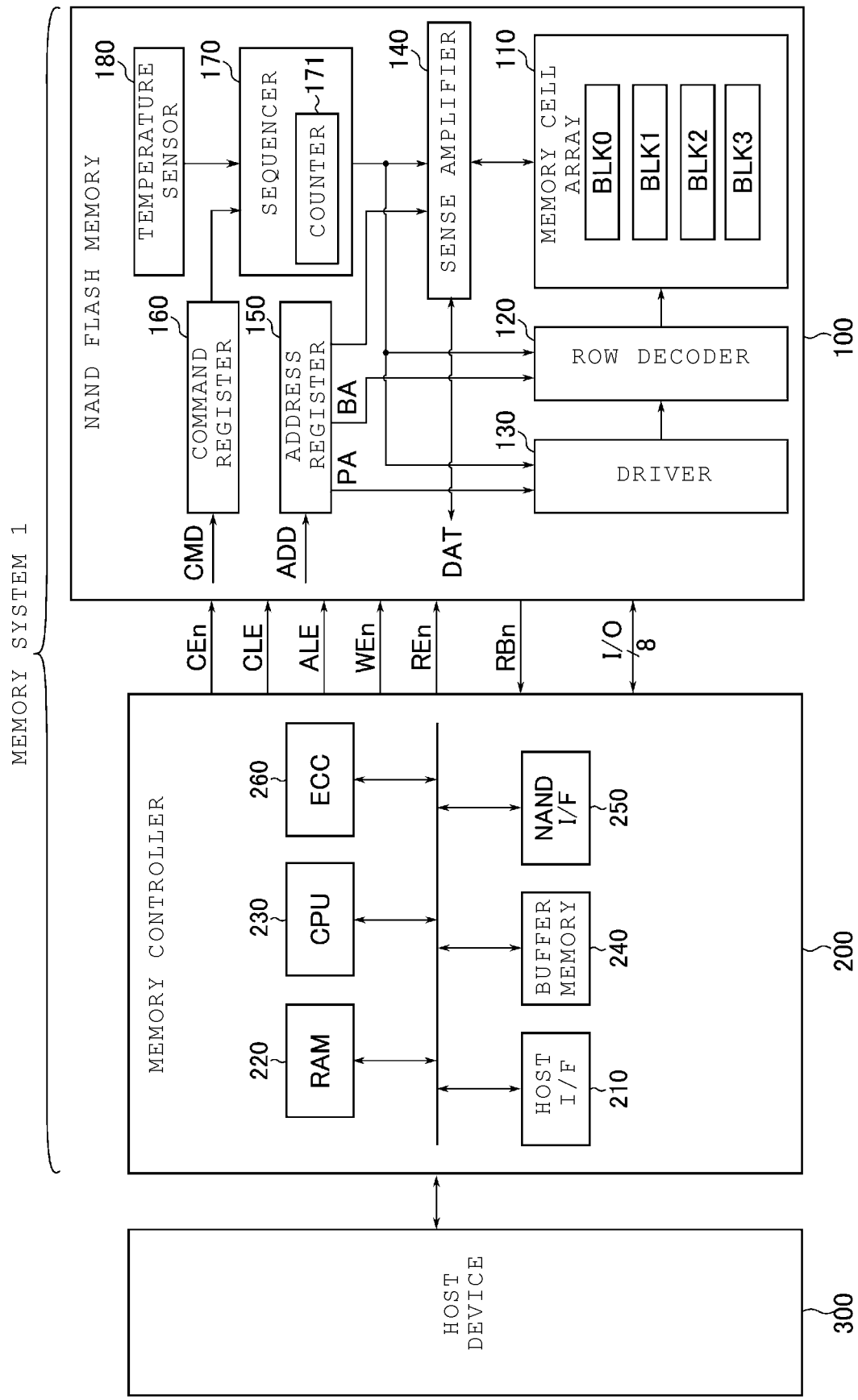
FIG. 1 is a block diagram illustrating a configuration of a memory system according to a first embodiment.

As illustrated in FIG. 1, a memory system 1 includes a semiconductor storage device (e.g., NAND flash memory) 100 and a memory controller 200. The NAND flash memory 100 and the memory controller 200 may form one semiconductor device by a combination thereof, and examples thereof include a memory card such as an SD™ card and a solid state drive (SSD).

The NAND flash memory 100 includes a plurality of memory cells and stores data in a non-volatile manner. The memory controller 200 is connected to the NAND flash memory 100 by a NAND bus, and is connected to a host device 300 by a host bus. The memory controller 200 controls the NAND flash memory 100, and accesses the NAND flash memory 100 in response to an instruction received from the host device 300. The host device 300 is, for example, a digital camera or a personal computer, and the host bus is, for example, a bus in accordance with an SD™ interface, a serial attached small computer system interface (SCSI) (SAS), a serial advanced technology attachment (ATA) (SATA), or a peripheral component interconnect express (PCIe). The NAND bus transmits and receives a signal in accordance with the NAND interface.

Specific examples of the signal of the NAND interface are a chip enable signal CEn, a command latch enable signal CLE, an address latch enable signal ALE, a write enable signal WEn, a read enable signal REn, a ready and busy signal RBn, and an input and output signal I/O.

The signal CEn is a signal for enabling the NAND flash memory 100, and is asserted at an "L (Low)" state. The signals CLE and ALE are signals for notifying the NAND flash memory 100 that the input signals I/O to the NAND flash memory 100 are respectively a command and an address. The signal REn is also asserted at the "L" state and is a signal for reading the output signal I/O from the NAND flash memory 100. The signal WEn is also asserted at the "L" state, and is a signal for supplying the input signal I/O into the NAND flash memory 100. The ready and busy signal RBn is a signal for indicating whether the NAND flash memory 100 is in a ready state (a state in which an instruction from the memory controller 200 can be received) or in a busy state (a state in which the instruction from the memory controller 200 cannot be received), and the "L" state indicates the busy state. The input and output signal I/O is, for example, an 8-bit signal. The input and output signal I/O contains data transmitted and received between the NAND flash memory 100 and the memory controller 200, and contains a command CMD, an address ADD, and data DAT such as write data and read data.

1.1.2 Memory Controller

Next, a configuration of the memory controller 200 will be described in detail with reference to FIG. 1.

The memory controller 200 is, for example, a system on a chip (SoC), and includes a host interface circuit 210, a random access memory (RAM) 220, a central processing unit (CPU) 230, a buffer memory 240, a NAND interface circuit 250, and an ECC circuit 260. Functions of the respective units 210 to 260 of the memory controller 200 described below may be implemented by either a hardware configuration or a combination of hardware resources and firmware running on a processor.

The host interface circuit 210 is connected to the host device 300 via the host bus, and transfers an instruction and data received from the host device 300 to the CPU 230 and the buffer memory 240, respectively. The host interface circuit 210 also transfers data in the buffer memory 240 to the host device 300 in response to an instruction of the CPU 230.

The RAM 220 is, for example, a semiconductor memory such as a DRAM, and is used as a work area of the CPU 230. The RAM 220 stores firmware for managing the NAND flash memory 100, and various management tables.

The CPU 230 controls an overall operation of the memory controller 200. For example, when receiving a write instruction from the host device 300, the CPU 230 issues the write instruction to the NAND interface circuit 250 in response thereto. The same applies to a read operation and an erasing operation. The CPU 230 also executes various processes for managing the NAND flash memory 100.

The buffer memory 240 temporarily stores write data and read data.

The NAND interface circuit 250 is connected to the NAND flash memory 100 via the NAND bus, and controls communication with the NAND flash memory 100. The NAND interface circuit 250 outputs the signals CEn, ALE, CLE, WEn, and REn to the NAND flash memory 100 based upon the instruction received from the CPU 230. When the write operation is performed, the NAND interface circuit 250 transfers a write command issued by the CPU 230 and the write data stored in the buffer memory 240 to the NAND flash memory 100 as the input and output signal I/O. When the read operation is performed, the NAND interface circuit 250 transfers a read command issued by the CPU 230 to the NAND flash memory 100 as the input and output signal I/O, further receives data read by the NAND flash memory 100 as the input and output signal I/O, and transfers the data to the buffer memory 240.

The ECC circuit 260 performs an error detection process and an error correction process for the data stored in the NAND flash memory 100. That is, the ECC circuit 260 generates an error correction code when writing the data, and adds the error correction code to the write data. The ECC circuit 260 decodes the error correction code when reading the data, and detects presence or absence of an error bit. When the error bit is detected, a position of the error bit is determined and the error is corrected. An error correction method includes, for example, a hard bit decoding process and a soft bit decoding process. As a hard bit decoding code used in the hard bit decoding process, for example, a Bose-Chaudhuri-Hocquenghem (BCH) sign and a Reed-Solomon (RS) code may be used. As a soft bit decoding code used in the soft bit decoding process, for example, a low density parity check (LDPC) code may be used.

1.1.3 NAND Flash Memory

Next, a configuration of the NAND flash memory 100 will be described. As illustrated in FIG. 1, the NAND flash memory 100 includes a memory cell array 110, a row decoder 120, a driver 130, a sense amplifier 140, an address register 150, a command register 160, a sequencer 170, and a temperature sensor 180.

The memory cell array 110 includes a plurality of blocks BLK including a plurality of non-volatile memory cells correlated with a row and a column. In FIG. 1, four blocks BLK0 to BLK3 are illustrated as an example. The memory cell array 110 stores the data given by the memory controller 200.

The row decoder 120 selects any one of the blocks BLK0 to BLK3 based upon a block address BA in the address register 150, and further selects a word line in the selected block BLK.

The driver 130 supplies a voltage to the selected block BLK via the row decoder 120 based upon a page address PA in the address register 150.

When the read operation of data is performed, the sense amplifier 140 senses a threshold voltage of the memory cell transistor in the memory cell array 110, and reads the data. Next, the sense amplifier 140 outputs the data DAT to the memory controller 200. When the write operation of data is performed, the sense amplifier 140 transfers the write data DAT received from the memory controller 200 to the memory cell array 110.

The address register 150 stores the address ADD received from the memory controller 200. The address ADD includes the above-described block address BA and page address PA. The command register 160 stores the command CMD received from the memory controller 200.

The temperature sensor 180 measures a temperature of the NAND flash memory 100, and transmits temperature information corresponding to the measured temperature to the sequencer 170. The temperature sensor 180 may be disposed at any position in the NAND flash memory 100, and it is preferable that the temperature sensor 180 can generate temperature information corresponding to a temperature of the memory cell array 110.

The sequencer 170 controls an overall operation of the NAND flash memory 100 based upon the command CMD stored in the command register 160. The sequencer 170 also includes a counter 171. The counter 171 is configured to start or end measurement at any timing in response to an instruction from the sequencer 170, and has a function of measuring the time required for various processes based on a counted-up value. The sequencer 170 can control the operation of the NAND flash memory 100 based upon the time measured by the counter 171. The sequencer 170 can control the operation of the NAND flash memory 100 based upon the temperature information acquired from the temperature sensor 180.

1.1.4 Memory Cell Array

Figure 2:
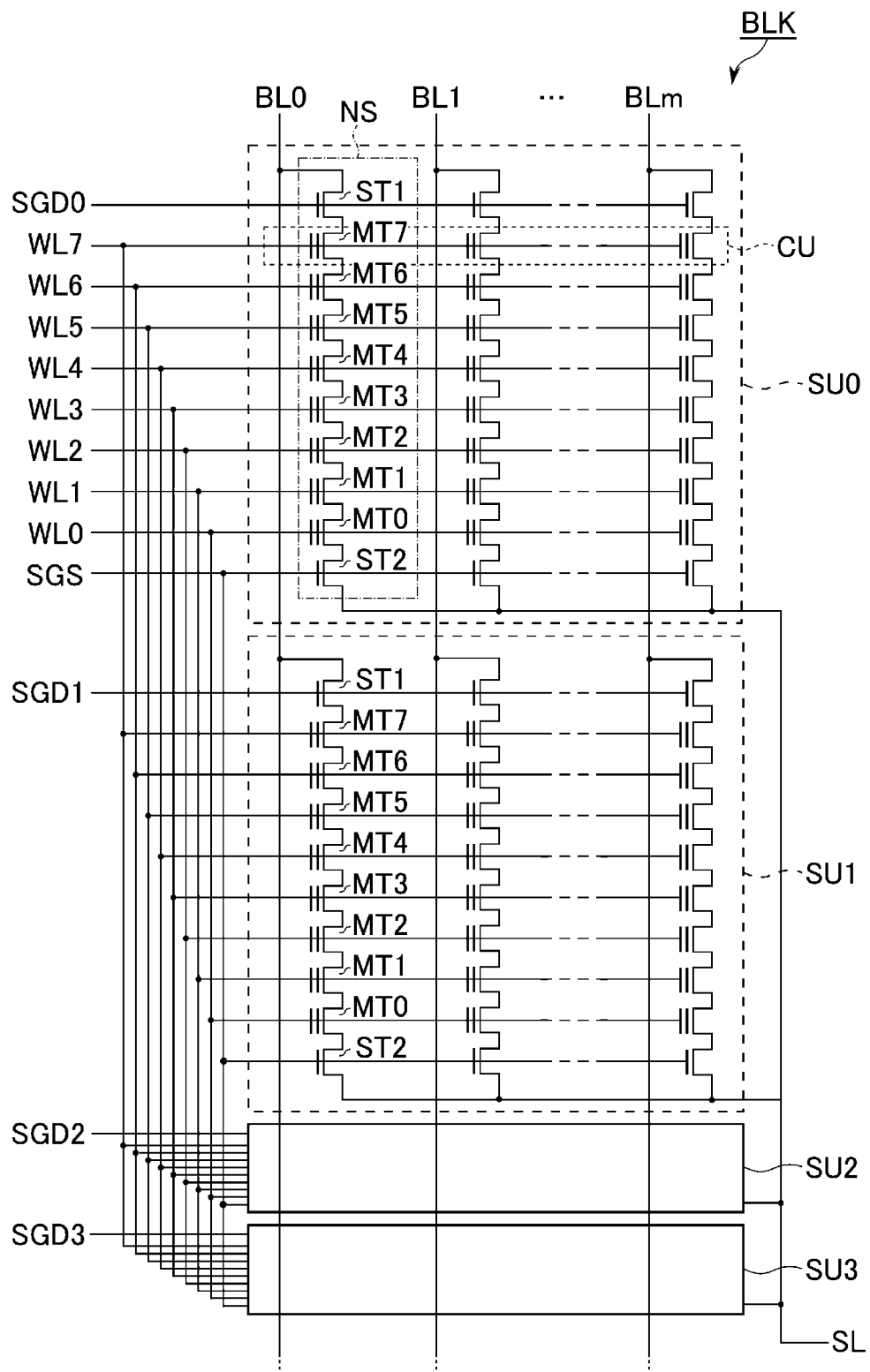
FIG. 2 is a circuit diagram illustrating a configuration of a memory cell array according to the first embodiment.

FIG. 2 is a circuit diagram illustrating a configuration of the memory cell array according to the first embodiment. FIG. 2 illustrates one block BLK among a plurality of blocks BLK in the memory cell array 110.

As illustrated in FIG. 2, the block BLK includes, for example, four string units SU (SU0 to SU3). Each string unit SU includes a plurality of NAND strings NS respectively associated with bit lines BL0 to BLm (m is an integer of 1 or more). Each NAND string NS includes, for example, eight memory cell transistors MT0 to MT7 and select transistors ST1 and ST2. The memory cell transistor MT includes a control gate and a charge storage layer, and stores a charge (e.g., an electron) corresponding to data in a non-volatile manner. Each of the select transistors ST1 and ST2 is used to select the string unit SU during various operations.

In each NAND string NS, the memory cell transistors MT0 to MT7 are connected to each other in series. A drain of the select transistor ST1 is connected to an associated bit line BL, and a source of the select transistor ST1 is connected to one end of the memory cell transistors MT0 to MT7 connected to each other in series. A drain of the select transistor ST2 is connected to the other end of the memory cell transistors MT0 to MT7 connected to each other in series. A source of the select transistor ST2 is connected to a source line SL.

In the same block BLK, the control gates of the memory cell transistors MT0 to MT7 are commonly connected to word lines WL0 to WL7, respectively. Gates of the select transistors ST1 in the string units SU0 to SU3 are connected to select gate lines SGD0 to SGD3, respectively. Gates of the select transistors ST2 therein are commonly connected to a select gate line SGS.

That is, the block BLK is a group of a plurality of string units SU sharing the same word lines WL0 to WL7. The block BLK is, for example, a data erasing unit. That is, the data stored in the memory cell transistor MT in the same block BLK are collectively erased.

The string unit SU is a group of a plurality of NAND strings NS, each of which is connected to a different bit line BL and connected to the same select gate line SGD. Among the string units SU, a group of the memory cell transistors MT commonly connected to the same word line WL is also referred to as a cell unit CU. For example, a group of bits stored in a plurality of memory cell transistors MT in the cell unit CU is defined as "one page". The cell unit CU may have a storage capacity of two or more pages of data, depending on the number of bits of data stored in the memory cell transistor MT.

The above-described circuit configuration of the memory cell array 110 is not limited to the above-described configuration. For example, the number of memory cell transistors MT and the number of select transistors ST1 and ST2 in each NAND string NS may be respectively designed to any number thereof. The number of string units SU in each block BLK may be designed to any number thereof.

1.1.5 Threshold Voltage Distribution of Memory Cell Transistors

Next, a threshold voltage distribution of the memory cell transistors MT will be described.

In the embodiment, one memory cell transistor MT can store, for example, 2-bit data. The 2-bit data include two bits which will be referred to as a lower bit and an upper bit, respectively. A group of the lower bits stored in the memory cells belonging to the same cell unit CU is referred to as a lower page, and a group of the upper bits stored therein is referred to as an upper page. That is, two pages are allocated to one word line WL (one cell unit CU) in one string unit SU, and the string unit SU including eight word lines WL has a capacity of 16 pages. Alternatively, in other words, the "page" may be defined as a part of a memory space formed in the cell unit CU. While erasing data is performed on a per block BLK unit basis, the write and read operations of data may be performed for each page or each cell unit CU.

Figure 3:
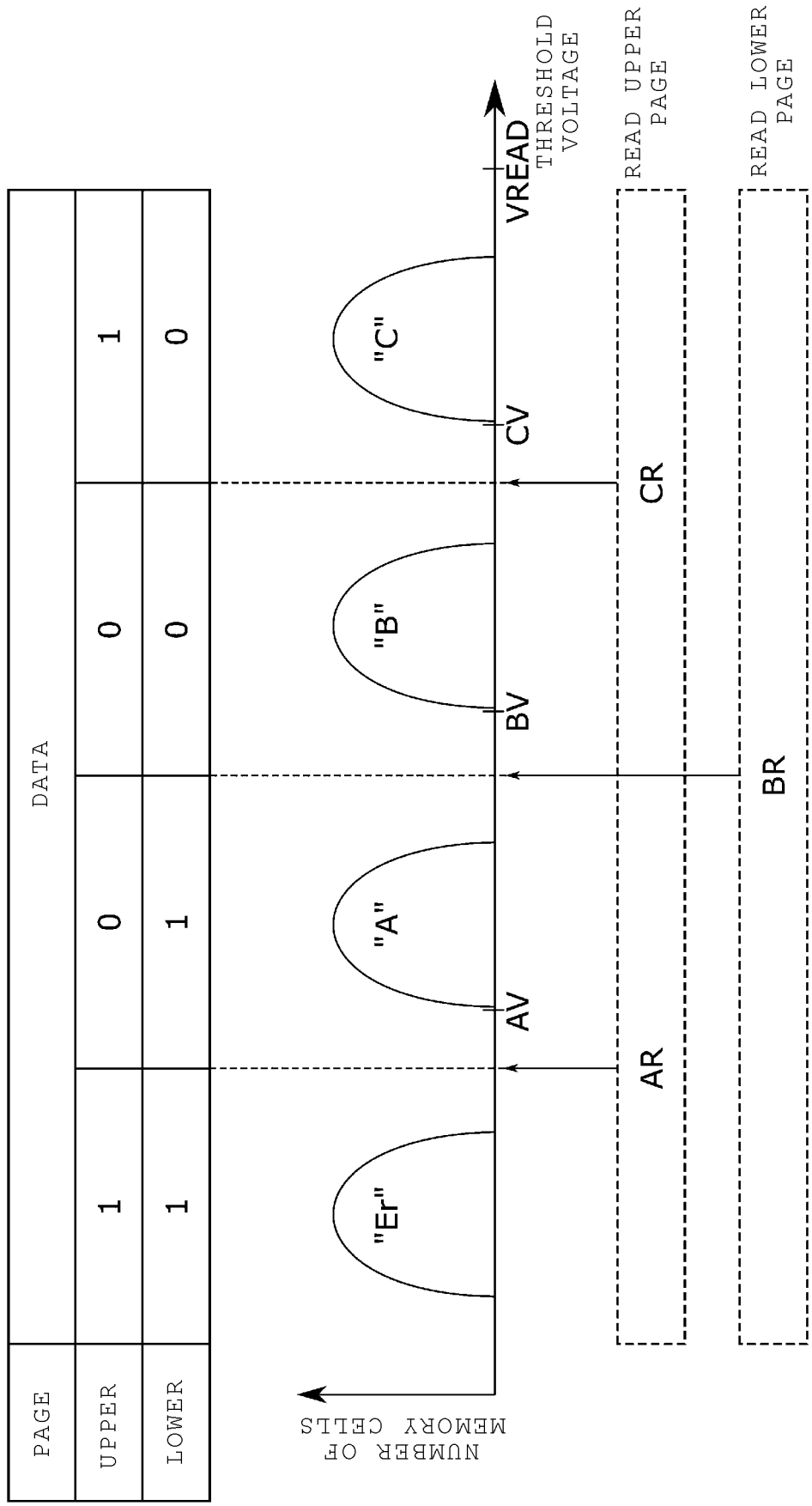
FIG. 3 is a schematic diagram illustrating a threshold voltage distribution of memory cell transistors according to the first embodiment.

FIG. 3 is a diagram illustrating a relationship between data that can be stored in each memory cell transistor MT and the threshold voltage distribution thereof.

As described above, the memory cell transistor MT can store 2-bit data. That is, the memory cell transistor MT can obtain four states according to the threshold voltage. These four states are referred to as an "Er" state, an "A" state, a "B" state, and a "C" state in order from the state having the lowest threshold voltage.

A threshold voltage of the memory cell transistor MT in the "Er" state is less than a voltage AR, and corresponds to a data erased state. A threshold voltage of the memory cell transistor MT in the "A" state is equal to or higher than the voltage AR and less than a voltage BR (>AR). A threshold voltage of the memory cell transistor MT in the "B" state is equal to or higher than the voltage BR and less than a voltage CR (>BR). A threshold voltage of the memory cell transistor MT in the "C" state is equal to or higher than the voltage CR and less than a voltage VREAD (>CR). Among the four states, the "C" state is a state having the highest threshold voltage. The voltages AR to CR may correspond to a read voltage VCGR that is used in the read operation. The voltage VREAD is, for example, a voltage applied to a non-selected word line WL (which is not a target word line of the read operation), and is a voltage that turns on the memory cell transistor MT connected to the non-selected WL regardless of the data stored therein.

The threshold voltage distribution is implemented by writing the 2-bit (2 pages) data which is formed of the above-described lower bit and upper bit. That is, a relationship between the "Er" state to the "C" state, and the lower bit and the upper bit is as follows:

"Er" state: "11" (described in the order of "upper/lower")
"A" state: "01"
"B" state: "00"
"C" state: "10"

In this manner, only one bit of the two bits changes between the data corresponding to the two states adjacent to each other in the threshold voltage distribution.

Therefore, when the lower bit is read out, a voltage corresponding to a boundary where a value of the lower bit ("0" or "1") changes may be used, and this also applies to the upper bit.

That is, as illustrated in FIG. 3, when the data of the lower page is read, the voltage BR for distinguishing the "A" state from the "B" state is used as a read voltage, thereby determining whether or not the threshold voltage of the memory cell transistor MT is less than the voltage BR (that is, equal to or higher than the voltage BR).

When the data of the upper page is read, the voltage AR for distinguishing the "Er" state from the "A" state and the voltage CR for distinguishing the "B" state from the "C" state are used as the read voltage. Accordingly, it is determined whether or not the threshold voltage of the memory cell transistor MT is less than the voltage AR or equal to or higher than the voltage CR (that is, equal to or higher than the voltage AR and less than the voltage CR).

A voltage AV corresponding to the "A" state is set between the voltage AR and the voltage BR, a voltage BV corresponding to the "B" state is set between the voltage BR and the voltage CR, and a voltage CV corresponding to the "C" state is set between the voltage CR and the voltage VREAD. The voltages AV to CV may correspond to a verification voltage VCGV that is used in a verification operation. In the write operation, the semiconductor storage device 100 increases the threshold voltages of the memory cell transistors MT belonging to the "A" to "C" states until the threshold voltages thereof respectively exceed the verification voltages AV to CV. Accordingly, the threshold voltages of the memory cell transistors MT belonging to the "A" to "C" states can be respectively distributed in regions higher than the read voltages AR to CR.

1.2 Operation

Next, an operation of the memory system according to the first embodiment will be described.

In the following description, a word line WL connected to the memory cell transistor MT to which data is written is referred to as a selected word line WL.

1.2.1 Outline of Write Operation

FIG. 4 is a command sequence and a timing chart illustrating an example of the write operation in the memory system according to the first embodiment. In FIG. 4, the signals I/O and RBn are communicated with the memory controller 200 during the write operation and a voltage applied to the selected word line WL during the write operation to be executed are shown in time series. As illustrated in FIG. 4, in a state before the write operation, for example, the signal RBn is at a "H" state, and a voltage VSS is applied to the selected word line WL. The voltage VSS is a ground voltage, and is, for example, 0V.

First, the memory controller 200 sequentially transmits command sets CS1 and CS2 to the semiconductor storage device 100 as a command set WCS for instructing the write operation. The command set CS1 includes the command CMD for instructing the write operation of the lower page and the address ADD, and the data DAT of the lower page. The command set CS2 includes the command CMD for instructing the write operation of the upper page and the address ADD, and the data DAT of the upper page.

Upon receiving the command set CS1, the semiconductor storage device 100 temporarily transitions from the ready state to the busy state, and stores the data DAT of the lower page in a latch circuit (which is not illustrated) in the sense amplifier 140.

Upon receiving the command set CS2, the semiconductor storage device 100 transitions from the ready state to the busy state, and stores the data DAT of the upper page independently of the data DAT of the lower page in a further latch circuit (not illustrated) in the sense amplifier 140. The semiconductor storage device 100 starts the write operation based upon the address ADD in the command sets CS1 and CS2, and the data of the lower page and the data of the upper page (hereinafter, simply referred to as the write data DAT). In the write operation, the sequencer 170 repeatedly executes a set of operations including the program operation and the verification operation. In the following description, the repeated set of operations, including the program operation and the verification operation, to be continuously executed after the program operation is also referred to as a program loop.

The program operation is an operation of increasing the threshold voltage of the memory cell transistor MT. In the program operation, a plurality of memory cell transistors MT in the cell unit CU connected to the selected word line WL are allowed or inhibited from increasing the threshold voltage according to a level of each threshold voltage. That is, the sequencer 170 sets the memory cell transistor MT whose threshold voltage does not reach the verification voltage in a state corresponding to the write data DAT as a program target, and sets the memory cell transistor MT reaching the verification voltage to program inhibition.

In the program operation, a program voltage VPGM is applied to the selected word line WL. The voltage VPGM is a voltage high enough to increase the threshold voltage of the memory cell transistor MT. When the program voltage VPGM is applied to the selected word line WL, the threshold voltage of the memory cell transistor MT connected to the selected word line WL and set to the program target increases. On the other hand, in the memory cell transistor MT connected to the selected word line WL and set to the program inhibition, for example, the NAND string NS including the memory cell transistor MT is controlled to be in a floating state, thereby preventing the threshold voltage of the memory cell transistor MT from increasing. When the program operation is completed, the sequencer 170 thereafter shifts to the verification operation.

The verification operation is a process of determining whether or not the threshold voltage of the memory cell transistor MT, which is a target to be written, reaches the verification voltage VCGV in the state corresponding to the write data DAT. In the verification operation, the verification voltage VCGV to be used can be appropriately changed according to the increase in the threshold voltage by the program operation. For example, in the verification operation in the first program loop, the verification voltage AV is used to determine whether or not the threshold voltage of the memory cell transistor MT written in the "A" state reaches the verification voltage AV. In the verification operation in the second and subsequent program loops, a plurality of verification voltages (for example, AV and BV) can be sequentially applied.

The memory cell transistor MT determined to reach the verification voltage VCGV in the state corresponding to the write data DAT is determined to pass the verification operation. The sequencer 170 counts the number of memory cell transistors MT not passing (that failed) the verification operation for each of the "A" to "C" states, and determines whether or not the write operation in each state is completed.

The set of operations including the program operation and the verification operation described above corresponds to one program loop. Each time the program loop is repeated, the program voltage VPGM is increased by a predetermined amount of increase, DVPGM1. That is, the program voltage VPGM applied to the selected word line WL increases according to the number of executed program loops.

Each time the program loop is repeated, the sequencer 170 determines, for example, whether or not the number of memory cell transistors MT not passing the verification operation falls below a predetermined number. When detecting that the number of memory cell transistors MT not passing the verification operation falls below the predetermined number, the sequencer 170 terminates the write operation, and allows the semiconductor storage device 100 to transition from the busy state to the ready state. When the write operation is completed, the data of two pages is written to the cell unit CU connected to the selected word line WL. A period tProg illustrated in the drawing corresponds to a period during which the write operation is executed. The period tProg is a metric indicating a speed at which the write operation is completed, and is desirably short.

1.2.2 Interrupt Operation

The semiconductor storage device according to the first embodiment can interrupt the write operation being executed, and can execute another process by allowing another process to interrupt the write operation being executed. In the following description, this other process is referred to as an "interrupt operation". The interrupt operation includes, for example, the read operation and the write operation of writing 1-bit data to the memory cell transistor MT.

FIG. 5 is a timing chart illustrating the interrupt operation according to the first embodiment. FIG. 5 illustrates an example of the signals I/O and RBn when the interrupt operation is executed during the write operation in time series. A status STS illustrated in FIG. 5 schematically shows an operation being executed at that time. For example, in FIG. 5, a status STS in which the program operation is being executed is indicated as "P", and a status STS in which the verification operation is being executed is indicated as "V".

As illustrated in FIG. 5, the memory controller 200 transmits the command set WCS to the semiconductor storage device 100. Upon receiving the command set WCS, the semiconductor storage device 100 transitions from the ready state to the busy state, and starts the write operation.

Next, the memory controller 200 transmits a suspend command xxh to the semiconductor storage device 100 which is in the middle of executing the write operation and in the busy state. The suspend command xxh is a command for instructing temporary interruption of a process being executed, and can be transmitted to the semiconductor storage device 100 at any timing. Upon receiving the suspend command xxh, the semiconductor storage device 100 interrupts the write operation, and transitions from the busy state to the ready state. A period tSTOPRST illustrated in FIG. 5 corresponds to a period from when the semiconductor storage device 100 receives the suspend command xxh until the write operation is interrupted and the semiconductor storage device 100 transitions to the ready state. The period tSTOPRST is a metric indicating a speed at which the semiconductor storage device 100 is set into a state where the interrupt operation can be executed, and is desirably short.

Upon detecting that the semiconductor storage device 100 transitions to the ready state, the memory controller 200 transmits a command set ICS of the interrupt operation to the semiconductor storage device 100. The command set ICS includes, for example, the command CMD and the address ADD that specifically instruct the process of interrupting the write operation. When the interrupt operation is the write operation, the write data DAT is included. Upon receiving the command set ICS, the semiconductor storage device 100 transitions from the ready state to the busy state, and starts the interrupt operation. When the interrupt operation is completed, the semiconductor storage device 100 transitions from the busy state to the ready state, and notifies the memory controller 200 of the end of the interrupt operation.

Upon detecting that the semiconductor storage device 100 transitions to the ready state, the memory controller 200 transmits a resume command yyh to the semiconductor storage device 100. The resume command yyh is a command for instructing the resumption of the process that was interrupted. Upon receiving the resume command yyh, the semiconductor storage device 100 transitions from the ready state to the busy state, and resumes the write operation. For example, the write operation is resumed from a process scheduled to be executed immediately after a process that was completed before the interruption. In the example of FIG. 5, since the write operation is interrupted in the middle of the verification operation, a portion, which is not executed before the interruption, of the verification operation scheduled to be executed in the program loop is executed after the resumption thereof. In some embodiments, the resume command yyh may be omitted.

The example of FIG. 5 shows a case in which the suspend command xxh and the command set ICS are independently transmitted to the semiconductor storage device 100, but embodiments are not limited to the case. For example, the command set ICS may include the suspend command xxh (the command for instructing the interrupt operation may also serve as the suspend command xxh). In this case, the memory controller 200 can transmit the command set ICS including the suspend command xxh to the semiconductor storage device 100 in the busy state. Upon receiving the command set ICS including the suspend command xxh, the semiconductor storage device 100 may interrupt the write operation and execute the interrupt operation.

The example of FIG. 5 also shows a case in which one interrupt operation is executed for one suspend command xxh, but embodiments are not limited to the case. For example, the memory controller 200 may transmit the command set ICS for further executing the interrupt operation after the first interrupt operation is completed, instead of the resume command yyh.

1.2.3 Write Operation in Consideration of Interruption

In the write operation in the semiconductor storage device according to the first embodiment, an amount of increase in the voltage VPGM in the program operation of the write operation after resumption is changed from DVPGM1, depending on presence or absence of interruption caused by the interrupt operation described above. The write operation that is interrupted by the interrupt operation will be described below.

Figure 6:
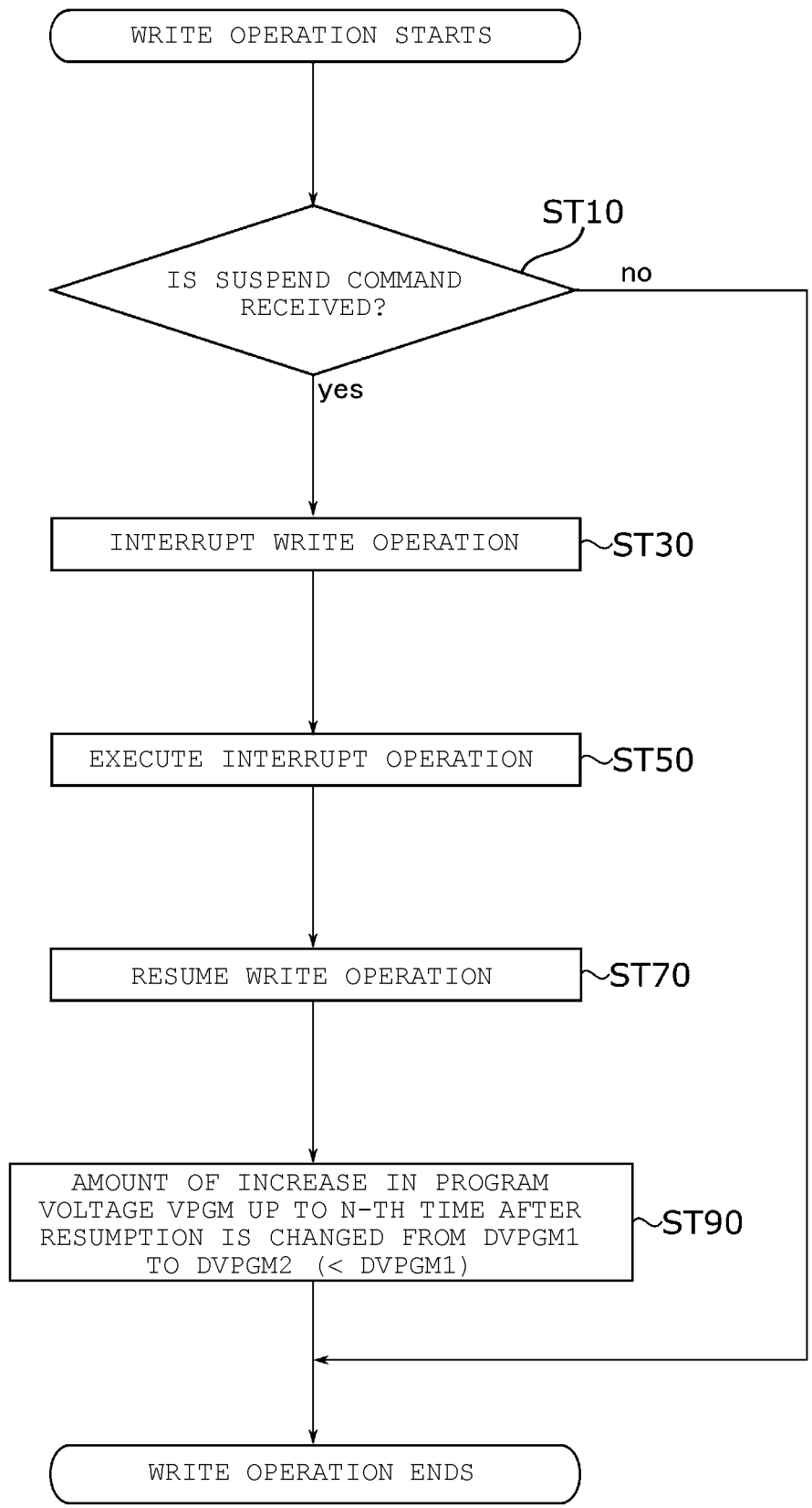
FIG. 6 is a flowchart illustrating a write operation that is interrupted, in the memory system according to the first embodiment.

FIG. 6 is a flowchart illustrating the write operation in consideration of interruption in the memory system according to the first embodiment.

As illustrated in FIG. 6, in step ST10, the sequencer 170 determines whether or not a suspend command is received during the write operation. As described above, the suspend command may be the unique command xxh for interrupting the operation being executed, or may be a general-purpose command such as the read command that can also interrupt the operation being executed. When it is determined that the suspend command is received (step ST10; yes), the process proceeds to step ST30, and when it is determined that the suspend command is not received (step ST10; no), the process continues with the execution of the write operation.

In step ST30, the sequencer 170 interrupts the write operation in response to the suspend command. The semiconductor storage device 100 transitions to the ready state, and enters a state in which the interrupt operation can be executed.

In step ST50, the sequencer 170 executes the interrupt operation.

In step ST70, the sequencer 170 resumes the write operation after the interrupt operation is completed.

In step ST90, the sequencer 170 changes an amount of increase in the program voltage VPGM in the program operation up to the n-th time after the write operation is resumed from DVPGM1 to DVPGM2 (the number n is an integer of 1 or more). The amount of increase DVPGM2 is a positive amount smaller than the amount of increase DVPGM1 (0<DVPGM2<DVPGM1). Accordingly, the row decoder 120 applies the program voltage VPGM whose amount of increase is changed to DVPGM2 to the selected word line WL in the program operation up to the first n-th time of the program operation to be executed after the write operation is resumed in step ST70.

In the program operation after the (n+1)th time after the write operation is resumed, the above-described change setting of the amount of increase is released, and the amount of increase becomes DVPGM1. The number n may be set to an upper limit value of the program loop in the write operation. In this case, once the amount of increase is changed to DVPGM2, the value is maintained until the end of the write operation.

As described above, the write operation that was interrupted, is completed.

Figure 7:
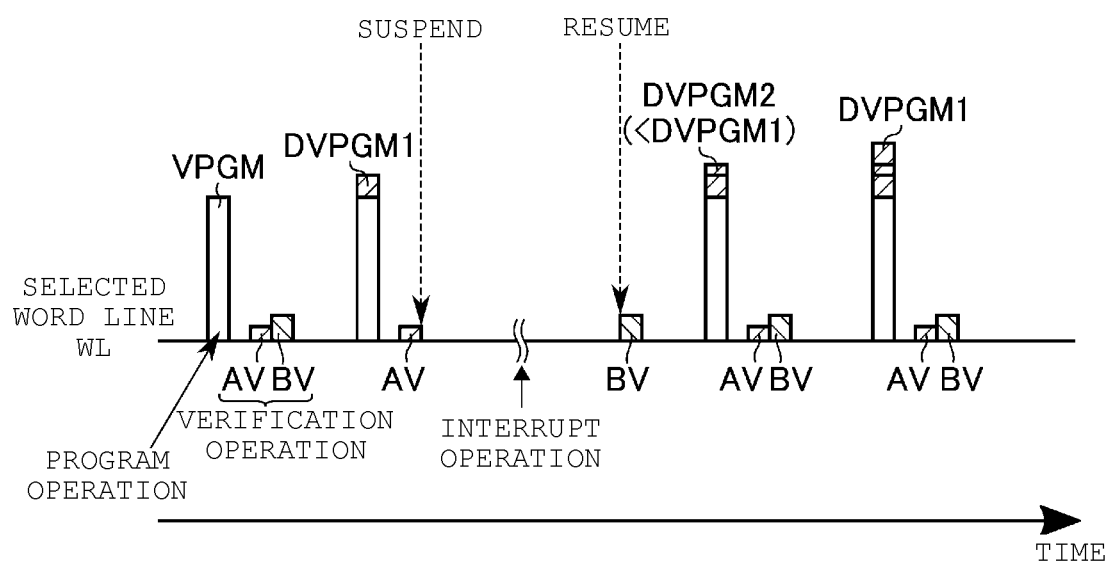
FIG. 7 is a timing chart illustrating the write operation that is interrupted, in the memory system according to the first embodiment.

FIG. 7 is a timing chart illustrating the write operation that is interrupted, in the memory system according to the first embodiment, and corresponds to FIG. 6. FIG. 7 illustrates a case in which the interrupt operation is executed in the middle of the verification operation of the second program loop in the drawing (more specifically, between a period during which the verification voltage AV is applied and a period during which the verification voltage BV is applied). FIG. 7 illustrates a case in which n=1 is set in step ST90 of FIG. 6. In the following description, for the convenience of description, the "the program loop of the X-th time in the drawing" is simply described as "the program loop of the X-th time".

As illustrated in FIG. 7, in the last program operation before the write operation is interrupted, the program voltage VPGM increases by the amount of increase DVPGM1 from the program voltage VPGM of the last second program operation before the write operation was interrupted. Next, after the write operation was interrupted and the interrupt operation has been executed, the sequencer 170 changes the amount of increase in the program voltage VPGM in the first program operation after the write operation is resumed to DVPGM2. Accordingly, the program voltage VPGM of the first program operation after the write operation is resumed increases by the amount of increase DVPGM2 from the program voltage VPGM of the last program operation before the write operation was interrupted. After that, the program voltage VPGM of the second program operation after the write operation was resumed increases by the amount of increase DVPGM1 from the program voltage VPGM of the first program operation after the write operation was resumed.

By performing the operation as described above, in the program operation immediately after resumption, the amount of increase in the program voltage VPGM can be suppressed to be lower than the normal amount of increase DVPGM1.

1.3 Effect According to the Embodiment

According to the first embodiment, when the write operation is interrupted, the sequencer 170 changes the amount of increase in the program voltage up to the first n-th time from DVPGM1 to DVPGM2 which is a positive number smaller than DVPGM1 in the program operation after resumption. Accordingly, the interrupt operation can be executed while preventing deterioration in the write operation.

More specifically, after increasing by the program operation, the threshold voltage of the memory cell transistor MT may decrease after a certain amount of time elapses.

Figure 8A:
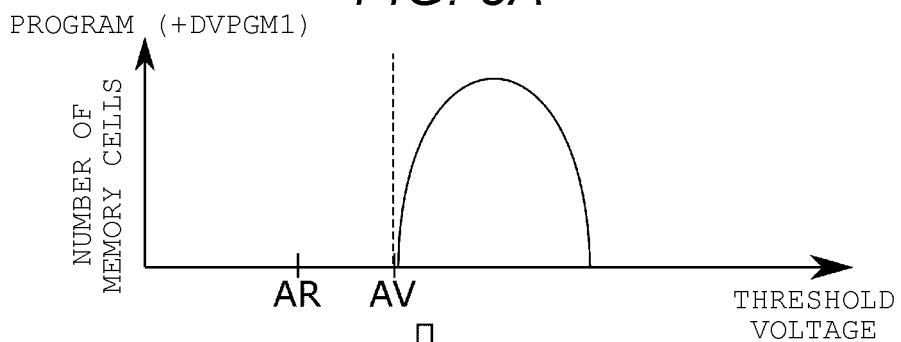
FIGS. 8A to 8C are schematic diagrams illustrating a change in a threshold voltage distribution in a write operation according to a comparative example.
Figure 8B:
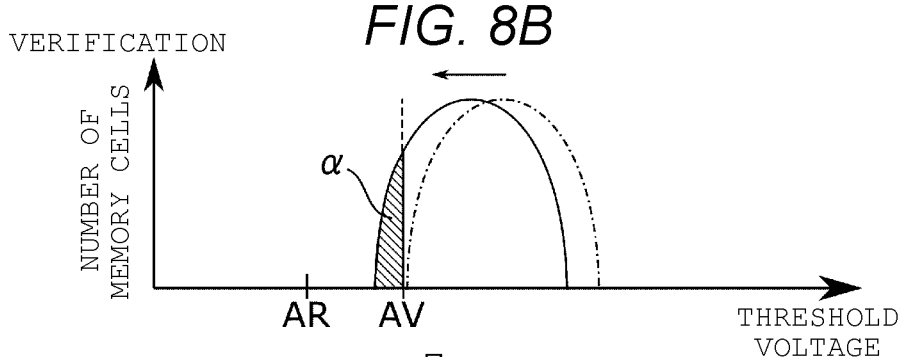
Figure 8C:
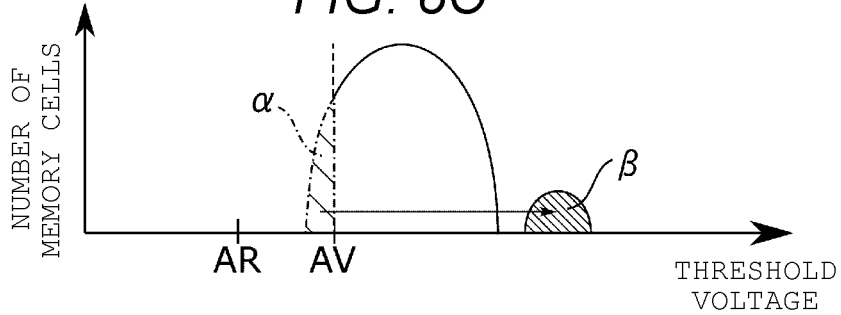
Figure 9A:
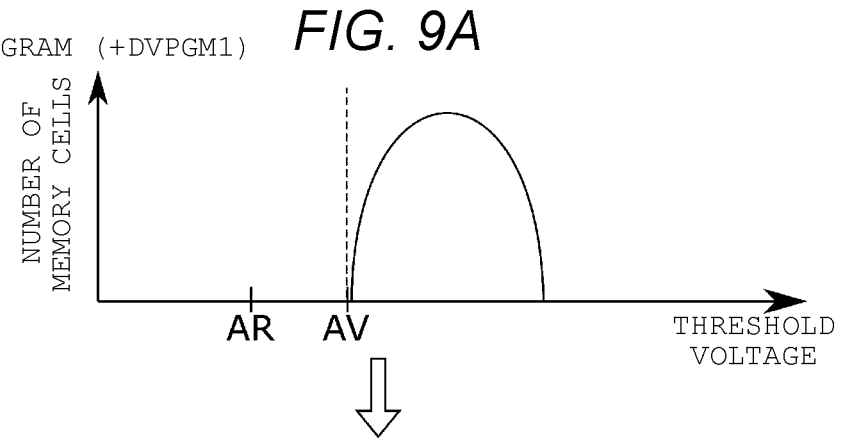
FIGS. 9A to 9C are schematic diagrams illustrating a change in a threshold voltage distribution in the write operation according to the first embodiment.
Figure 9B:
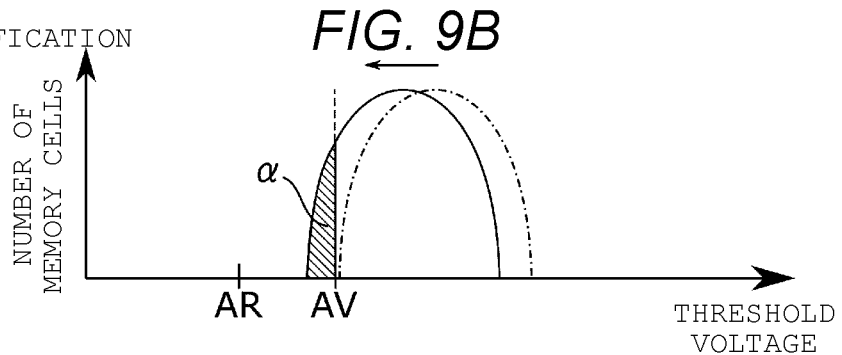
Figure 9C:
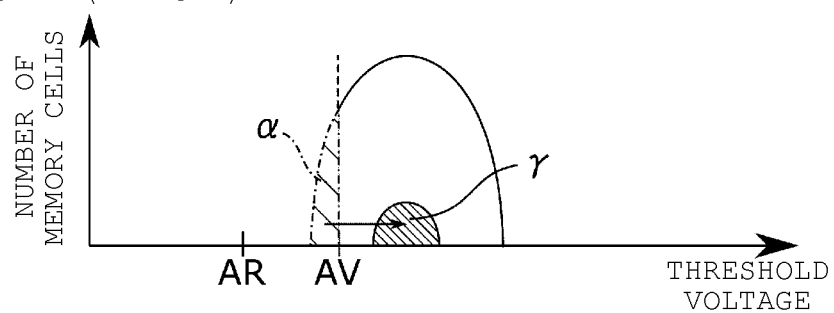

FIGS. 8A to 8C are schematic diagrams illustrating a change in a threshold voltage of a memory cell transistor in a write operation according to a comparative example. FIGS. 9A to 9C are a schematic diagrams illustrating a change in the threshold voltage of the memory cell transistor in the write operation according to the first embodiment. Examples of FIGS. 8 and 9 show the threshold voltage distribution of a group of memory cell transistors MT scheduled to be written to be in the "A" state. The example of FIG. 8 is different from that of FIG. 9 in that the program voltage VPGM is stepped up by the amount of increase DVPGM1 regardless of whether or not the write operation was interrupted.

As illustrated in FIG. 8A, the program voltage VPGM based upon the amount of increase DVPGM1 is applied to the selected word line WL by the program operation in a certain program loop. Accordingly, the threshold voltage of the group of memory cell transistors MT increases to the extent that the threshold voltage thereof exceeds the verification voltage AV.

However, upon receiving the suspend command before the verification operation scheduled to be continuously executed in the program operation is started, the sequencer 170 interrupts the write operation and executes the interrupt operation. Accordingly, a certain amount of time elapses until the verification operation is executed, and the threshold voltage of the group of memory cell transistors MT decreases. Therefore, the threshold voltage of a portion of the group of memory cell transistors MT whose threshold voltage is relatively low becomes lower than the verification voltage AV.

As illustrated in FIG. 8B, in the verification operation in the resumed write operation after the interrupt operation is completed, the memory cell transistor MT whose threshold voltage belongs to a threshold voltage distribution α which is lower than the verification voltage AV is determined to fail in the verification operation.

Thereafter, as illustrated in FIG. 8C, in the program operation to be continuously executed after the above-described verification operation, the memory cell transistor MT whose threshold voltage belongs to the threshold voltage distribution α is set as the program target. Therefore, the memory cell transistor MT whose threshold voltage belongs to the threshold voltage distribution α has the threshold voltage thereof increased based upon the amount of increase DVPGM1, thereby forming a new threshold voltage distribution β. Since the amount of increase in the threshold voltage can be excessive depending on a magnitude of the amount of increase DVPGM1, the above-described method of increasing the threshold voltage may not be desirable from a viewpoint of forming a threshold voltage distribution having a narrow dispersion.

As illustrated in FIGS. 9A and 9B, the first embodiment is the same as the comparative example in that the threshold voltage decreases by the interruption of the write operation accompanying the interrupt operation, and the memory cell transistor MT that fails in the verification operation is generated. However, as illustrated in FIG. 9C, in the program operation after resumption, the amount of increase in the program voltage VPGM is changed to DVPGM2 which is smaller than DVPGM1.

Accordingly, the amount of increase in the threshold voltage of the memory cell transistor MT belonging to the threshold voltage distribution α becomes smaller than that when the amount of increase in the program voltage VPGM is DVPGM1. Therefore, a new threshold voltage distribution γ formed by the program voltage VPGM when the amount of increase is DVPGM2, does not increase the dispersion of the entire threshold voltage distribution. Therefore, it is possible not only to form a threshold voltage distribution having a narrower dispersion, but also to reduce a possibility of erroneous reading in the read operation to be executed later.

While the amount of increase in the threshold voltage of the program operation by the amount of increase DVPGM2 is smaller than that of the program operation by the amount of increase DVPGM1, the program operation by the amount of increase DVPGM2 can increase the threshold voltage higher than the program operation in which the amount of increase is 0. Accordingly, the time until the write operation is completed (period tProg) can be shortened as compared with a case in which the threshold voltage is not increased at all.

2. Second Embodiment

Next, a second embodiment will be described. The first embodiment describes the case in which it is determined whether or not it is necessary to execute a countermeasure against a decrease in the threshold voltage after the program operation, based upon whether or not the write operation was interrupted. The second embodiment will describe a case in which it is determined whether or not it is necessary to execute the countermeasure against a decrease in the threshold voltage after the program operation, further based upon a determination result of whether or not the interrupt operation to be executed during the interruption satisfies a condition. Hereinafter, the description of the same configuration and operation as those of the first embodiment will be omitted, and a configuration and an operation different from those of the first embodiment will be mainly described.

2.1 Write Operation in Consideration of Interruption

Figure 10:
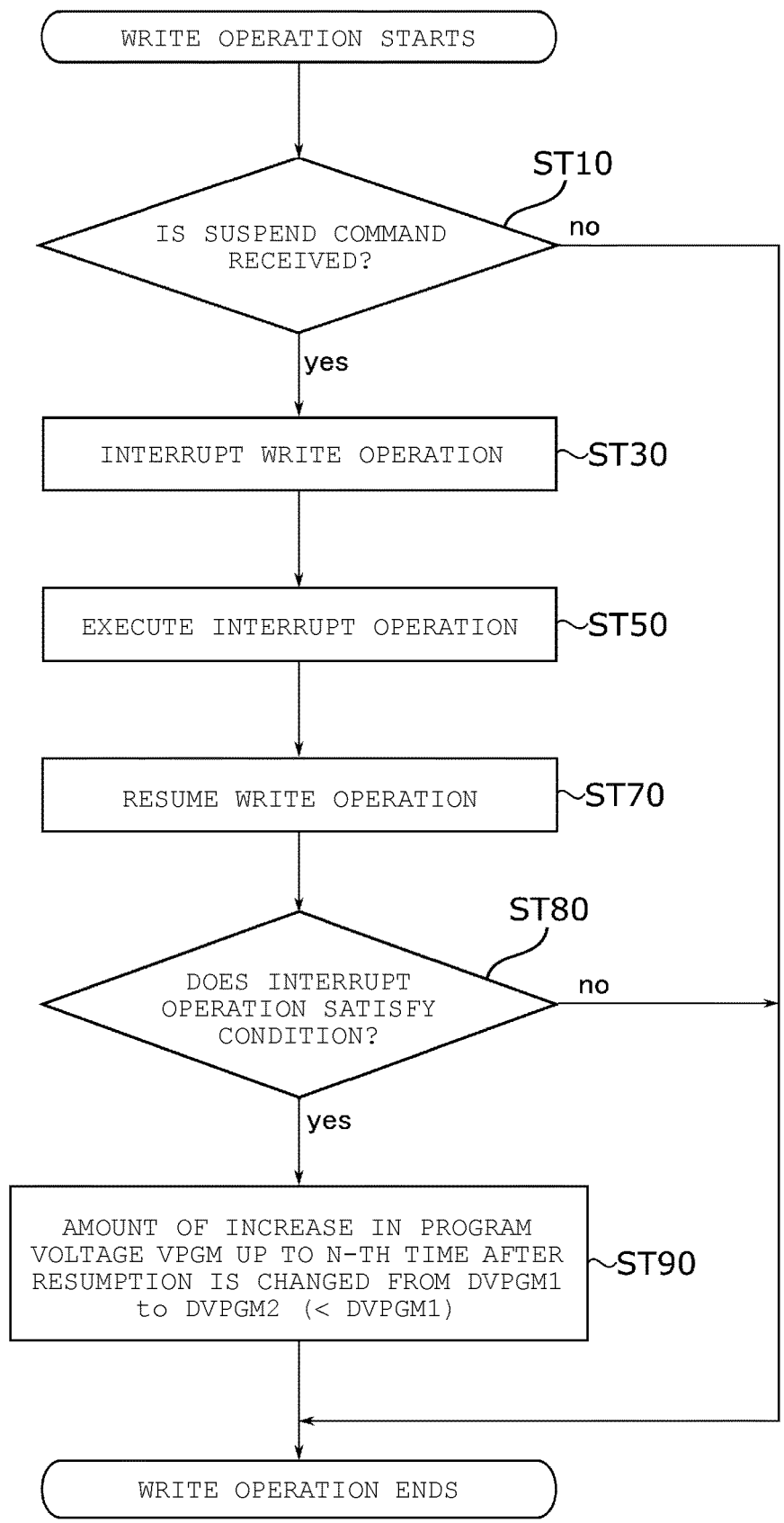
FIG. 10 is a flowchart illustrating a write operation that is interrupted, in a memory system according to a second embodiment.

FIG. 10 is a flowchart illustrating a write operation in consideration of interruption in a memory system according to the second embodiment, and corresponds to FIG. 6 in the first embodiment. In FIG. 10, step ST80 is added between step ST70 and step ST90 in FIG. 6.

As illustrated in FIG. 10, since the processes in steps ST10 to ST70 are the same as those in FIG. 6, the description thereof will be omitted.

In step ST80, the sequencer 170 determines whether or not the interrupt operation satisfies a condition. When it is determined that the interrupt operation satisfies the condition (step ST80; yes), the process proceeds to step ST90. When it is determined that the interrupt operation does not satisfy the condition (step ST80; no), the process continues with the execution of the write operation without changing the amount of increase in the program operation from DVPGM1.

In step ST90, the sequencer 170 changes the amount of increase in the program voltage VPGM in the program operation from the resumption of the write operation to the n-th time from DVPGM1 to DVPGM2.

As described above, the write operation that was interrupted, is completed.

Various conditions can be applied to the condition related to the interrupt operation determined in step ST80. A specific example thereof will be described below.

2.1.1 Execution Timing of Interrupt Operation

Figure 11:
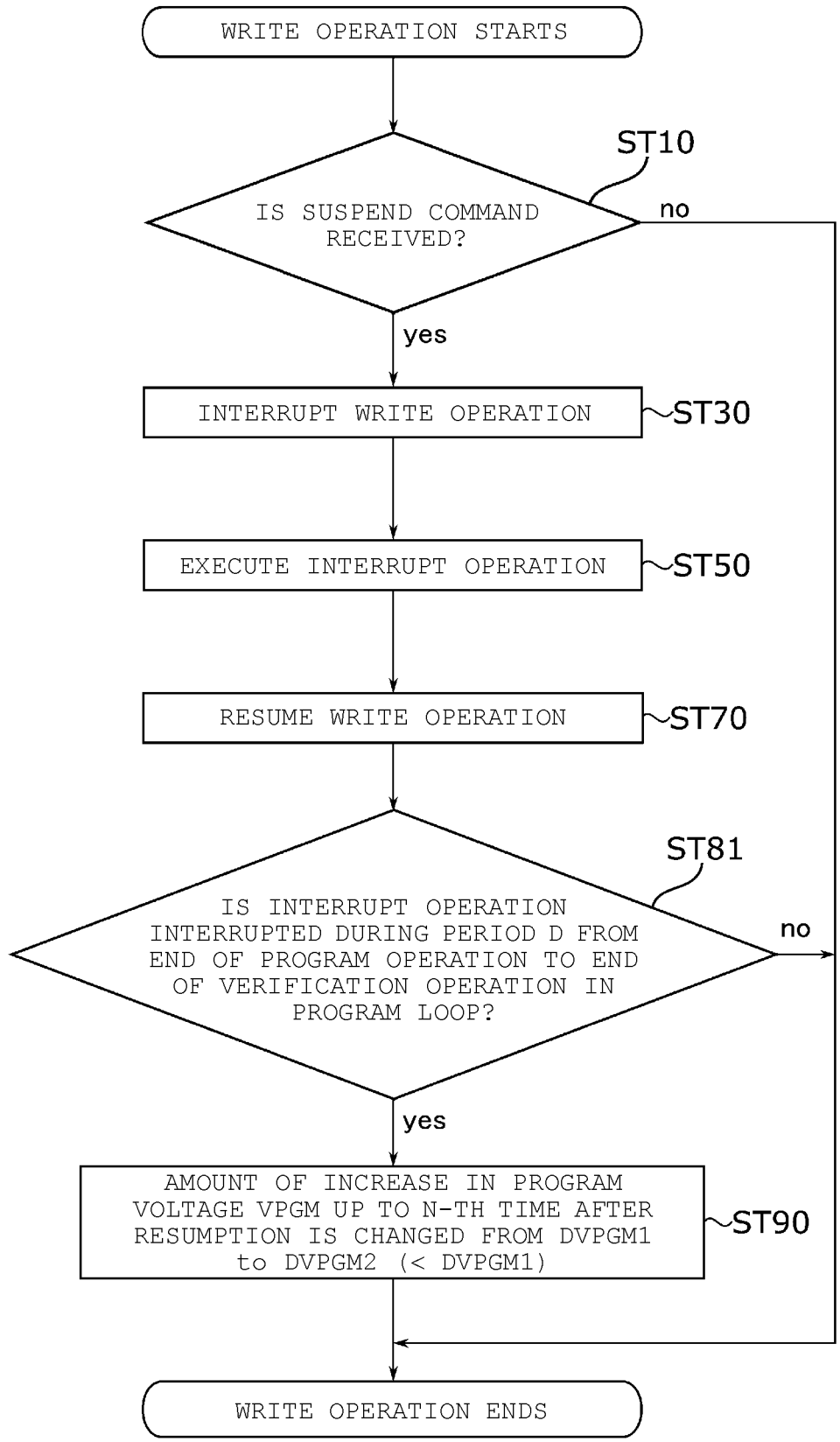
FIG. 11 is a flowchart illustrating a write operation that is interrupted, in a memory system according to a first example of the second embodiment.

First, a first example will describe a case in which the condition includes an execution timing of the interrupt operation with reference to a flowchart illustrated in FIG. 11. In the example of FIG. 11, step ST81 is shown as the first example specifically showing step ST80 in FIG. 10.

As shown in step ST81, the sequencer 170 determines whether or not the interrupt operation is interrupted during a period D from the end of the program operation in a certain program loop to the end of the verification operation to be continuously executed after the program operation. When the write operation is interrupted within the period D (step ST81; yes), the process proceeds to step ST90. When the write operation is not interrupted within the period D (step ST81; no), the process continues with the execution of the write operation without changing the amount of increase in the program operation from DVPGM1.

Figure 12A:
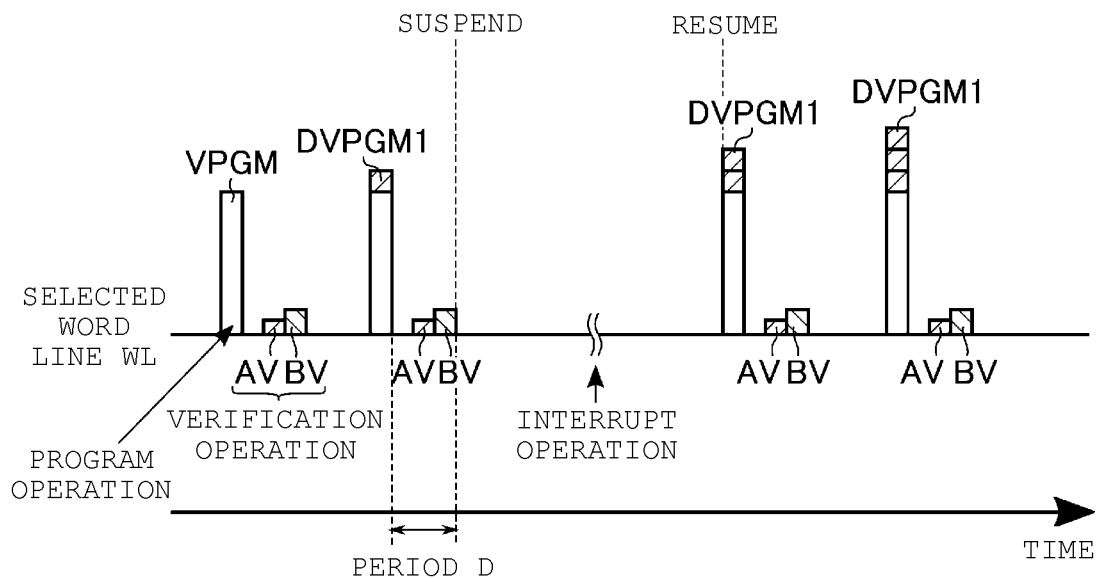
FIGS. 12A and 12B are timing charts illustrating the write operation that is interrupted, in the memory system according to the first example of the second embodiment.
Figure 12B:
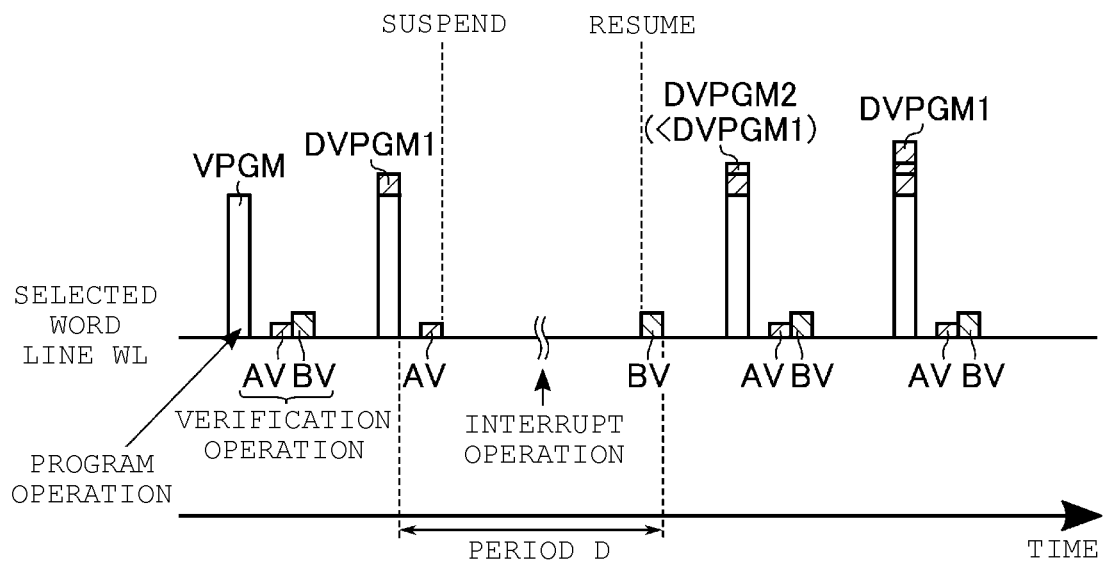

FIGS. 12A and 12B are timing charts illustrating the write operation that is interrupted, in the memory system according to the first example of the second embodiment.

In the example of FIG. 12A, the interrupt operation is executed after all the verification operations in the second program loop are completed and before the program operation in the third program loop has started. That is, in the example of FIG. 12A, the write operation is interrupted in a period other than the period D. In this case, the verification operation in the second program loop is executed promptly after the immediately preceding program operation is completed. Therefore, a phenomenon where the threshold voltage that was increased by the program operation in the second program loop, decreases does not affect the verification operation that is continuously executed after the program operation. That is, a phenomenon where the memory cell transistor MT to be passed in the verification operation in the second program loop, is determined to have failed due to the lapse of time does not occur. Therefore, the amount of increase in the program voltage VPGM of the program operation in the third program loop is not changed from DVPGM1.

On the other hand, in the example of FIG. 12B, in the verification operation of the second program loop, the interrupt operation is executed between a period during which the verification voltage AV is applied and a period during which the verification voltage BV is applied. That is, in the example of FIG. 12B, the write operation is interrupted within the period D. In this case, the verification operation in the second program loop is not executed until the interrupt operation has completed after the immediately preceding program operation has completed. Therefore, the phenomenon where the threshold voltage that was increased by the program operation in the second program loop, decreases can affect the verification operation that is continuously executed after the program operation. That is, the phenomenon where the memory cell transistor MT to be passed in the verification operation in the second program loop is determined to have failed due to the lapse of time can occur. Therefore, the amount of increase in the program voltage VPGM of the program operation in the third program loop is changed from DVPGM1 to DVPGM2.

By performing the operation as described above, when the write operation is interrupted due to the occurrence of the interrupt operation, it is possible to determine whether or not the amount of increase in the program voltage VPGM should be changed by taking into account the execution timing of the interrupt operation as the condition.

2.1.2 Length of Interrupt Operation Period

Figure 13:
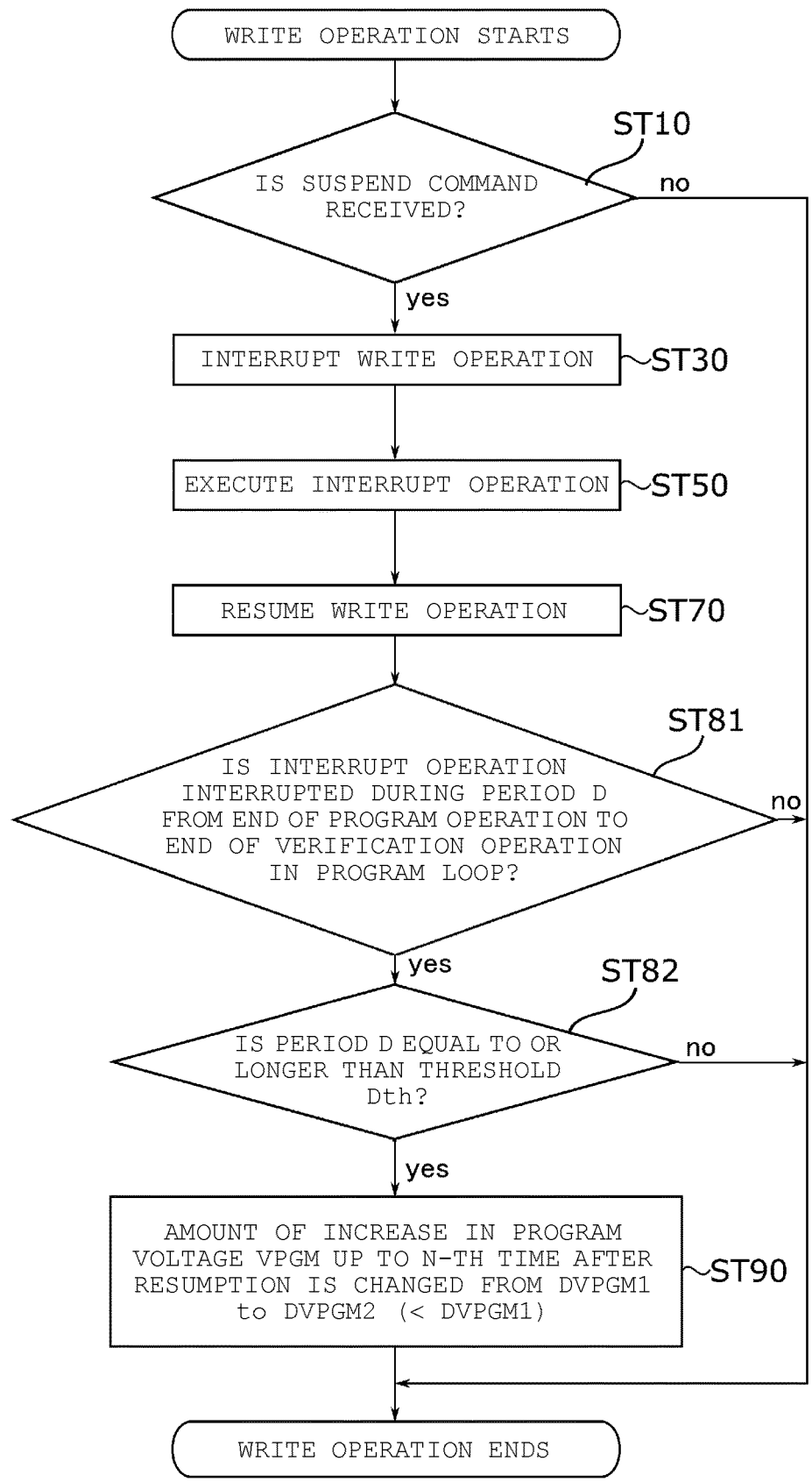
FIG. 13 is a flowchart illustrating a write operation that is interrupted, in a memory system according to a second example of the second embodiment.

Next, a second example will describe a case in which the condition includes a length of the period during which the interrupt operation is executed with reference to a flowchart illustrated in FIG. 13. In the example of FIG. 13, steps ST81 and ST82 are shown as the second example specifically showing step ST80 in FIG. 10.

Since step ST81 is the same as that of FIG. 11, the description thereof will be omitted.

As shown in step ST82, the sequencer 170 determines whether or not the period D (that is, a period from the end of the program operation immediately before the interrupt operation to the end of the verification operation which is executed up to the program operation immediately after the interrupt operation) is equal to or longer than a threshold Dth by including the interrupt operation. Specifically, for example, the counter 171 in the sequencer 170 counts the period D from the end of the program operation to the end of the verification operation for each program loop. The sequencer 170 determines whether or not the length of the period D is equal to or longer than the threshold Dth by comparing a count value of the counter 171 with the predetermined threshold Dth. The threshold Dth corresponds to, for example, a period until the threshold voltage of the memory cell transistor MT that was increased by the program operation, decreases due to the lapse of time.

When the period D is equal to or longer than the threshold Dth (step ST82; yes), the process proceeds to step ST90. When the period D is shorter than the threshold Dth (step ST82; no), the process continues with the execution of the write operation without changing the amount of increase in the program operation from DVPGM1.

Figure 14A:
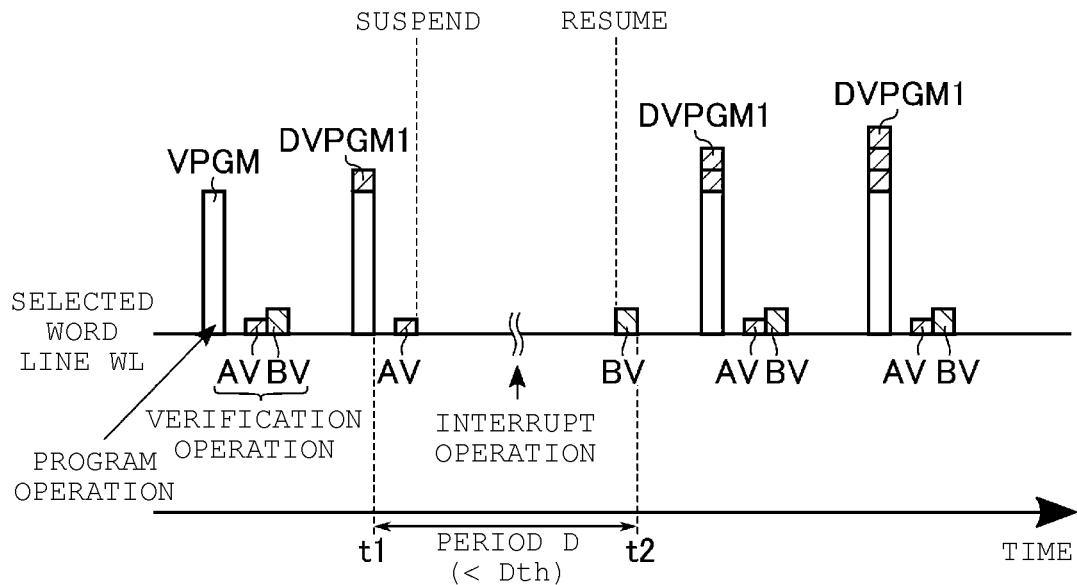
FIGS. 14A and 14B are timing charts illustrating the write operation that is interrupted, in the memory system according to the second example of the second embodiment.
Figure 14B:
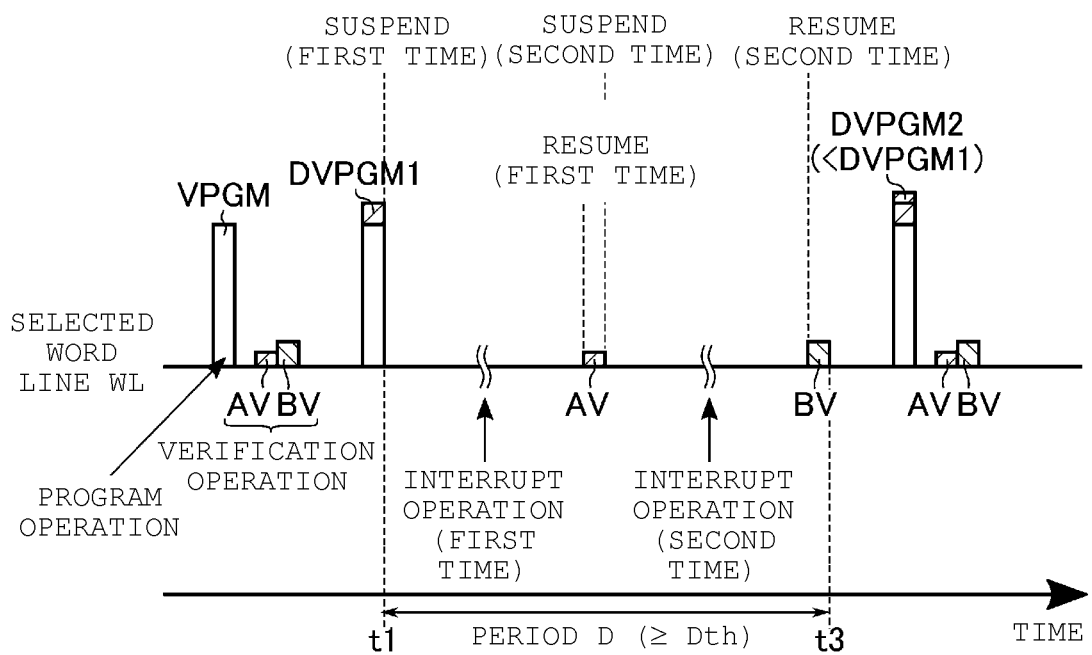

FIGS. 14A and 14B are timing charts illustrating the write operation that is interrupted, in the memory system according to the second example of the second embodiment.

In the example of FIG. 14A, during the verification operation in the second program loop, the interrupt operation is executed once after a period during which the voltage AV is applied ends and before a period during which the voltage BV is applied starts. That is, in the example of FIG. 14A, the write operation is interrupted and the interrupt operation is executed once within the period D. In this case, the length of the period D is shorter than the threshold Dth, and the phenomenon where the threshold voltage that was increased by the program operation in the second program loop, decreases is determined not to affect the verification operation that is continuously executed after the program operation (even in the period during which the voltage BV is applied). That is, the phenomenon where the memory cell transistor MT to be passed in the verification operation in the second program loop, is determined to have failed due to the lapse of time does not occur. Therefore, the amount of increase in the program voltage VPGM of the program operation in the third program loop is not changed from DVPGM1.

On the other hand, in the example of FIG. 14B, the interrupt operation is executed once after the program operation of the second program loop is completed and before the verification operation starts. During the verification operation of the second program loop, the interrupt operation is executed once more after the period during which the voltage AV is applied, ends and before the period during which the voltage BV is applied starts. That is, the interrupt operation is executed twice within the period D. In this case, the length of the period D is equal to or longer than the threshold Dth, and it is determined that the phenomenon where the threshold voltage that was increased by the program operation in the second program loop, decreases can affect the verification operation that is continuously executed after the program operation (particularly, in the period during which the voltage BV is applied). That is, the phenomenon where the memory cell transistor MT to be passed in the verification operation in the second program loop, is determined to have failed due to the lapse of time can occur. Therefore, the amount of increase in the program voltage VPGM of the program operation in the third program loop is changed from DVPGM1 to DVPGM2.

By performing the operation as described above, it is possible to determine whether or not the amount of increase in the program voltage VPGM should be changed by taking into account the length of the interrupt operation to be executed during the period that can affect the result of the verification operation as the condition.

The above-described example describes a case in which the length of the period D is measured by the count value of the counter 171, but embodiments are not limited to this case. For example, the length of the period D may be measured by the number of times the interrupt operation is executed within the period D. When this case is applied to the example of FIG. 14, the threshold Dth becomes "twice".

2.1.3 Type of Interrupt Operation

Next, a third example will describe a case in which the condition includes a type of interrupt operation with reference to a flowchart illustrated in FIG. 15. In the example of FIG. 15, steps ST81 and ST83 are shown as the third example specifically showing step ST80 in FIG. 10.

Since step ST81 is the same as that of FIG. 11, the description thereof will be omitted.

As shown in step ST83, the sequencer 170 determines whether or not the interrupt operation is executed based upon a predetermined command among commands transmitted from the memory controller 200. When the interrupt operation is executed based upon the predetermined command (step ST83; yes), the process proceeds to step ST90. When the interrupt operation is executed based upon a command other than the predetermined command (step ST83; no), the process continues with the execution of the write operation without changing the amount of increase in the program operation from DVPGM1.

For example, the predetermined command includes, as the interrupt operation, a command for instructing the execution of a new write operation, a command for instructing the execution of an erasing operation, and a command for instructing the execution of a read operation using a plurality of read voltages. An example of the read operation using the plurality of read voltages includes, for example, an upper page read operation with respect to the memory cell transistor MT in which 2-bit data is stored, a tracking operation for acquiring the threshold voltage distribution in the cell unit CU, and a read operation of determining the read voltage in the second read operation based upon a result of the first read operation. It is not necessary to set all the read operations using the plurality of read voltages as the above-described predetermined command, and a command corresponding to any operation thereof can be set as the predetermined command.

By performing the operation as described above, when the interrupt operation requiring a relatively long period of time is executed such that the period D is assumed to be equal to or longer than the threshold Dth, the amount of increase in the program voltage VPGM can be changed to DVPGM2. When the interrupt operation requiring only a relatively short period of time is executed such that the period D is assumed to be shorter than the threshold Dth, the amount of increase in the program voltage VPGM can be prevented from being changed from DVPGM1.

2.1.4 Temperature During Execution of Interrupt Operation

Figure 16:
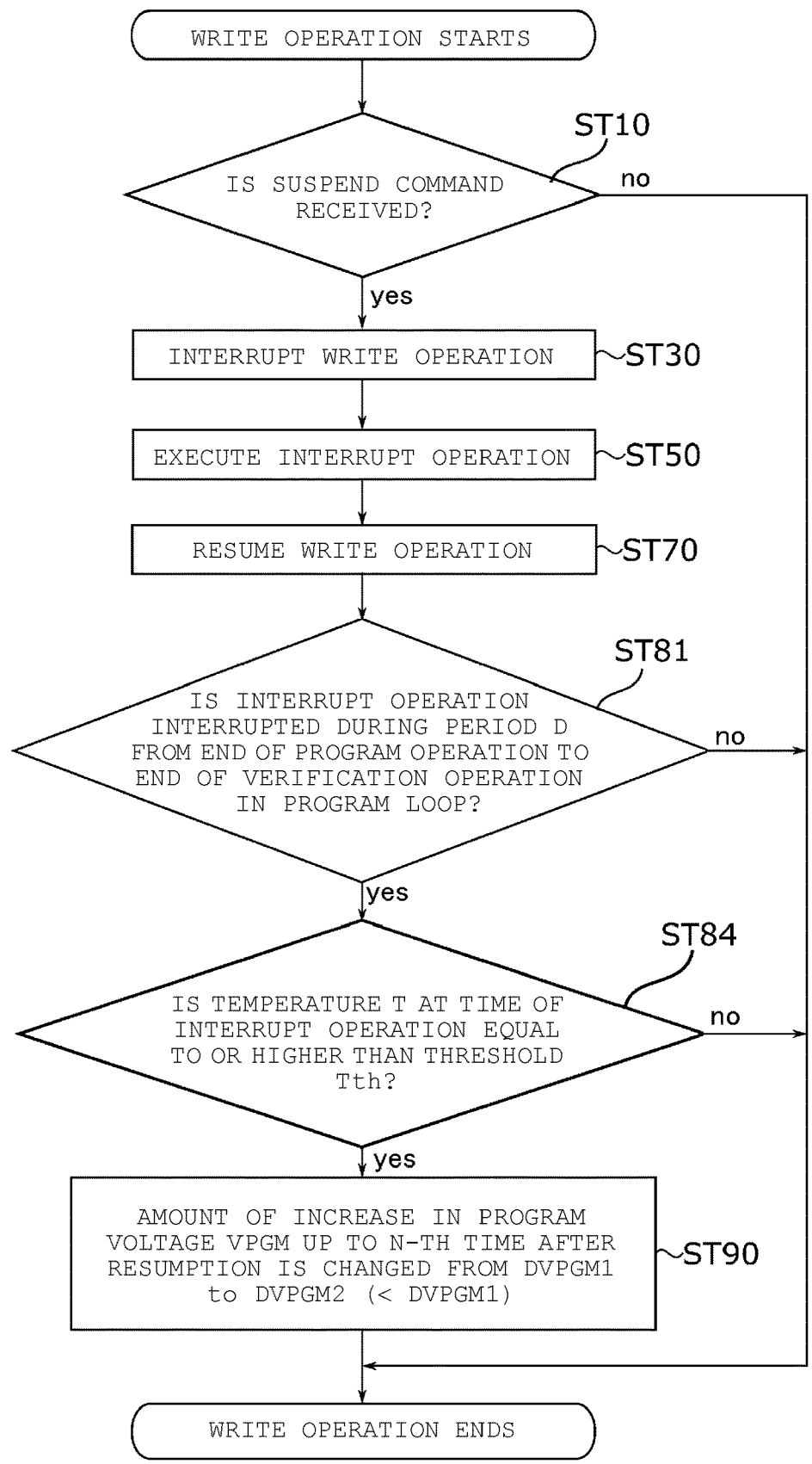
FIG. 16 is a flowchart illustrating a write operation that is interrupted, in a memory system according to a fourth example of the second embodiment.

Next, a fourth example will describe a case in which the condition includes a temperature of the semiconductor storage device 100 during execution of the interrupt operation with reference to a flowchart illustrated in FIG. 16. In the example of FIG. 16, steps ST81 and ST84 are shown as the fourth example specifically showing step ST80 in FIG. 10.

Since step ST81 is the same as that of FIG. 11, the description thereof will be omitted.

As shown in step ST84, the sequencer 170 determines whether or not a temperature T of the semiconductor storage device 100 during the execution of the interrupt operation is equal to or higher than a threshold Tth. Specifically, for example, the temperature sensor 180 measures the temperature T of the semiconductor storage device 100 during the execution of the interrupt operation, and transmits temperature information corresponding to the temperature T to the sequencer 170. The sequencer 170 determines whether or not the temperature T is equal to or higher than the predetermined threshold Tth based upon the temperature information. The threshold Tth corresponds to, for example, a temperature at which the period until the threshold voltage of the memory cell transistor MT that was increased by the program operation, decreases is significantly shortened. When it is determined that the temperature T is equal to or higher than the threshold Tth (step ST84; yes), the process proceeds to step ST90. When it is determined that the temperature T is less than the threshold Tth (step ST84; no), the process continues with the execution of the write operation without changing the amount of increase in the program operation from DVPGM1.

By performing the operation as described above, it is possible to consider the case in which the period until the threshold voltage thereof decreases depends on the temperature T. That is, when the temperature T during the execution of the interrupt operation is equal to or higher than the threshold Tth at which the threshold voltage is likely to decrease, the amount of increase in the program voltage VPGM can be changed to DVPGM2. When the temperature T during the execution of the interrupt operation is less than the threshold Tth at which the threshold voltage is likely to decrease, the amount of increase in the program voltage VPGM is not changed from DVPGM1.

2.2 Effect According to Embodiment

According to the second embodiment, the sequencer 170 determines whether or not to change the amount of increase in the program voltage VPGM from DVPGM1 to DVPGM2 based upon whether or not the interrupt operation satisfies the condition. Accordingly, it is possible to determine in more detail a case in which an influence of the decrease in the threshold voltage affects the verification operation immediately after resumption and a case in which the influence thereof does not affect the verification operation. Therefore, it is possible to prevent an increase in the number of cases in which step ST90 is executed (that is, a case in which the amount of increase in the program voltage VPGM becomes small). Therefore, it is possible not only to prevent a decrease in the amount of increase in the threshold voltage by the program operation, but also to shorten the execution period tProg of the program operation.

3. Third Embodiment

Next, a third embodiment will be described. The second embodiment describes a case in which the program voltage VPGM in at least the first program operation after resumption is increased by a smaller amount of increase, in consideration of the influence from the interruption of the write operation accompanied by the interrupt operation satisfying the condition, but embodiments are not limited to the case. The third embodiment will describe a case in which the program voltage VPGM in the first program operation after resumption is not increased in consideration of the influence from the interruption of the write operation accompanied by the interrupt operation satisfying the condition. In the following description, the description of the same configuration and operation as those of the second embodiment will be omitted, and a configuration and an operation different from those of the second embodiment will be mainly described.

3.1 Write Operation in Consideration of Interruption

Figure 17:
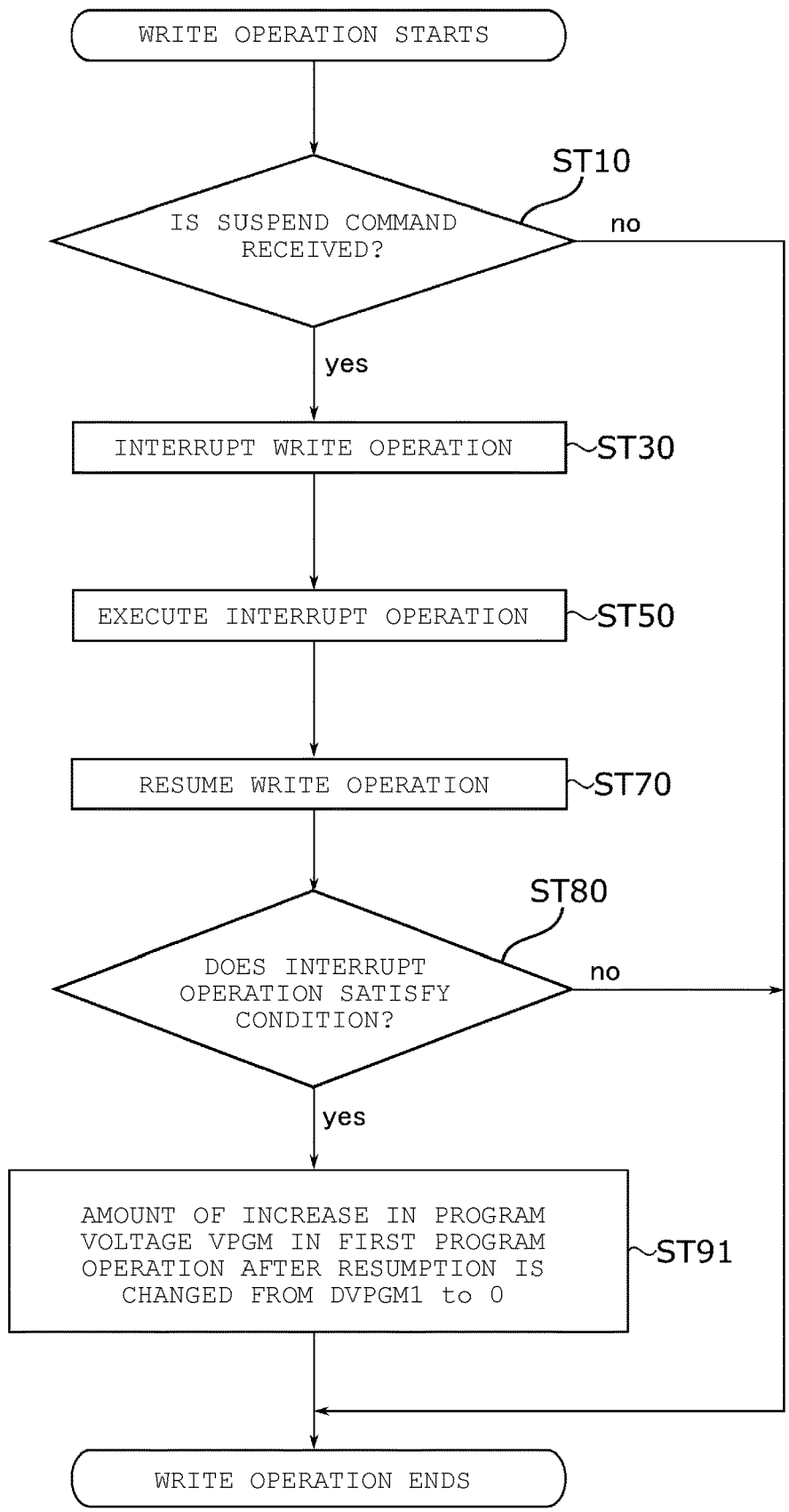
FIG. 17 is a flowchart illustrating a write operation that is interrupted, in a memory system according to a third embodiment.

FIG. 17 is a flowchart illustrating a write operation in consideration of interruption in a memory system according to the third embodiment, and corresponds to FIG. 10 in the second embodiment. In FIG. 17, step ST91 is executed instead of step ST90 in FIG. 10.

As illustrated in FIG. 17, since the processes in steps ST10 to ST80 are the same as those in FIG. 10, the description thereof will be omitted. Various conditions shown in the second embodiment can be similarly applied to the condition applied to the interrupt operation determined in step ST80.

In step ST91, the sequencer 170 does not increase the program voltage VPGM in the first program operation after the write operation is resumed from the program voltage VPGM in the program operation immediately before the write operation is interrupted. That is, the sequencer 170 sets the amount of increase in the program voltage VPGM in the first program operation after the write operation is resumed, to 0.

The sequencer 170 increases the program voltage VPGM in the second and subsequent program operations after the write operation is resumed by, for example, the amount of increase DVPGM1 for each program loop.

As described above, the write operation that was interrupted, is completed.

Figure 18:
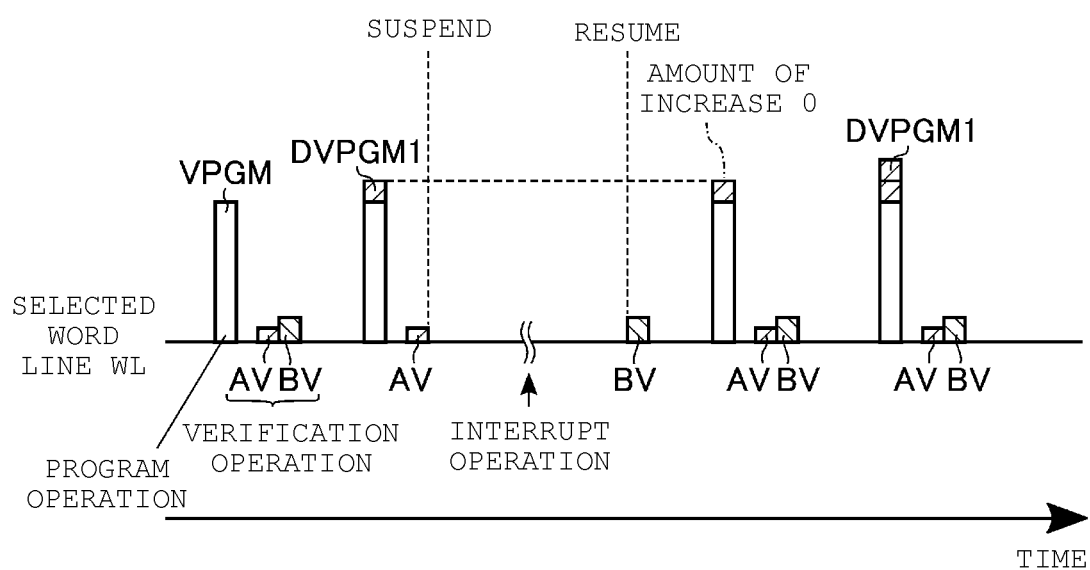
FIG. 18 is a timing chart illustrating the write operation that is interrupted, in the memory system according to the third embodiment.

FIG. 18 is a timing chart illustrating the write operation that is interrupted, in the memory system according to the third embodiment, and corresponds to FIG. 17. FIG. 18 illustrates a case in which the interrupt operation satisfying the condition is executed in the middle of the verification operation of the second program loop.

As illustrated in FIG. 18, the sequencer 170 sets the amount of increase DVPGM1 as the amount of increase in the program voltage VPGM before the write operation is interrupted. When the write operation is interrupted and the interrupt operation satisfying the condition is executed, the sequencer 170 does not increase the program voltage VPGM in the first program operation after the write operation is resumed from the program voltage VPGM of the program operation immediately before the interruption. Accordingly, in the program operation in the third program loop, the program voltage VPGM having the same level as that of the program operation in the second program loop is applied to the selected word line WL. After that, in the program operation in the fourth and subsequent program loops, the program voltage VPGM increased by the amount of increase DVPGM1 is applied to the selected word line WL from the program operation in the second and third program loops.

3.2 Effect According to the Embodiment

According to the third embodiment, the sequencer 170 determines whether or not to increase the program voltage VPGM of the program operation immediately after resumption based upon whether or not the interrupt operation satisfies the condition. When the threshold voltage of the memory cell transistor MT is expected to decrease due to the interruption of the write operation, the sequencer 170 does not increase the program voltage VPGM of the program operation immediately after resumption. Accordingly, in the first program operation immediately after resumption, the threshold voltage of the memory cell transistor MT can be increased only to the same degree as the program operation immediately before the interruption. That is, the sequencer 170 can execute the first program operation immediately after resumption as a program operation of returning the threshold voltage to a state after the execution of the program operation immediately before the interruption. Therefore, it is possible to prevent the threshold voltage of the memory cell transistor MT whose threshold voltage decreases from being excessively increased by the first program operation immediately after resumption. Therefore, deterioration in the performance of the write operation can be prevented.

When the interrupt operation does not satisfy the condition, the sequencer 170 increases the program voltage VPGM by the amount of increase DVPGM1 in the first program operation immediately after resumption. Accordingly, when the interrupt operation is not expected to contribute to the decrease in the threshold voltage of the memory cell transistor MT, the threshold voltage of the memory cell transistor MT can be quickly increased from the first program operation immediately after resumption. Therefore, an increase in the period tProg can be prevented.

4. Fourth Embodiment

Next, a fourth embodiment will be described. The second embodiment and the third embodiment describe a case in which the amount of increase in the program voltage VPGM in at least the first program operation after resumption is changed from DVPGM1 in consideration of the influence by the interruption of the write operation accompanied by the interrupt operation satisfying the condition, and are not limited to the case. The fourth embodiment will describe a case in which the verification voltage VCGV in the first verification operation after resumption is lowered in consideration of the influence by the interruption of the write operation accompanied by the interrupt operation satisfying the condition. In the following description, the description of the same configuration and operation as those of the second embodiment will be omitted, and a configuration and an operation different from those of the second embodiment will be mainly described.

4.1 Write Operation in Consideration of Interruption

Figure 19:
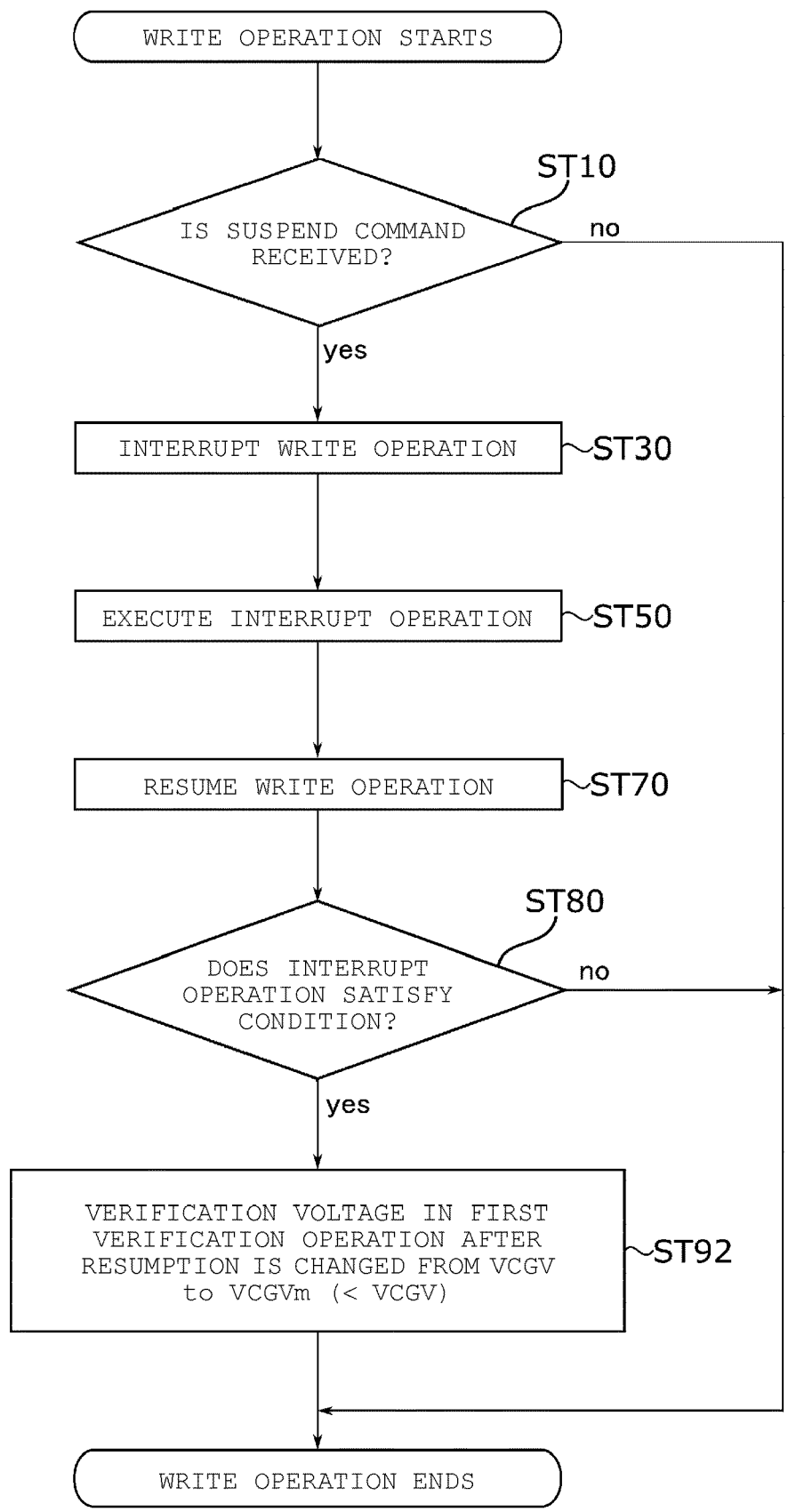
FIG. 19 is a flowchart illustrating a write operation that is interrupted, in a memory system according to a fourth embodiment.

FIG. 19 is a flowchart illustrating a write operation in consideration of interruption in a memory system according to the fourth embodiment, and corresponds to FIG. 10 in the second embodiment. In FIG. 19, step ST92 is executed instead of step ST90 in FIG. 10.

As illustrated in FIG. 19, since the processes in steps ST10 to ST80 are the same as those in FIG. 10, the description thereof will be omitted. Various conditions shown in the second embodiment can be similarly applied to the condition applied to the interrupt operation determined in step ST80.

In step ST92, in the first verification operation after the write operation is resumed, the row decoder 120 applies a verification voltage VCGVm lower than the verification voltage VCGV to the selected word line WL (VCGVm<VCGV). The verification voltage VCGVm is set for each of the verification voltages AV to CV. That is, a verification voltage AVm is lower than the verification voltage AV. A verification voltage BVm is lower than the verification voltage BV and higher than the verification voltage AV (AV<BVm<BV). A verification voltage CVm is lower than the verification voltage CV and higher than the verification voltage BV (BV<CVm<CV).

The row decoder 120 applies the verification voltage VCGV to the selected word line WL in the second and subsequent verification operations after the write operation is resumed.

As described above, the write operation that was interrupted, is completed.

Figure 20:
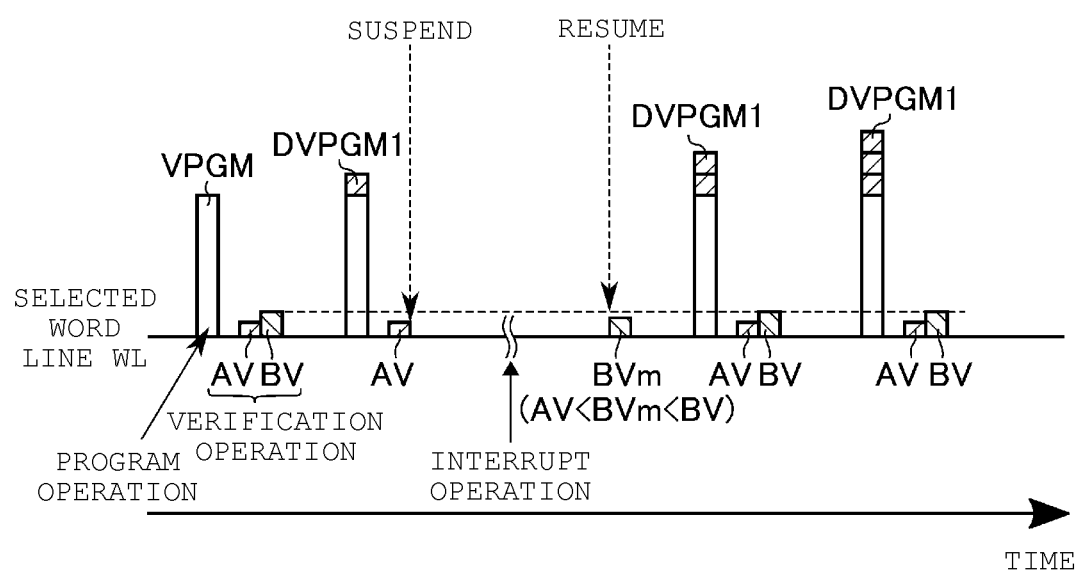
FIG. 20 is a timing chart illustrating the write operation that is interrupted, in the memory system according to the fourth embodiment.

FIG. 20 is a timing chart illustrating the write operation that is interrupted, in the memory system according to the fourth embodiment, and corresponds to FIG. 19. In FIG. 20, it is determined whether or not the memory cell transistor MT written in the "A" state and the "B" state passes the verification operation in all the program loops in the drawing. FIG. 20 illustrates a case in which the interrupt operation satisfying the condition is executed in the middle of the verification operation of the second program loop.

As illustrated in FIG. 20, in the verification operation of the second program loop in the drawing, the voltage AV is applied to the selected word line WL before the write operation is interrupted. Accordingly, the sense amplifier 140 determines whether or not the memory cell transistor MT written in the "A" state passes the verification operation by using the voltage AV (VCGV).

On the other hand, when the write operation is interrupted and the interrupt operation satisfying the condition is executed, the voltage BVm is applied to the selected word line WL. Accordingly, the sense amplifier 140 determines whether or not the memory cell transistor MT written in the "B" state passes the verification operation by using the voltage BVm (VCGVm).

In this manner, even though the write operation is interrupted in the middle of the verification operation in the same program loop, when the interrupt operation satisfies the condition, the verification voltage VCGVm is applied to the selected word line WL in the verification operation immediately after resumption.

In the second and subsequent verification operations after resumption, the verification voltage VCGV is applied to the selected word line WL.

4.2 Effect According to the Embodiment

According to the fourth embodiment, the sequencer 170 determines whether or not to lower the verification voltage of the verification operation immediately after resumption from VCGV, based upon whether or not the interrupt operation satisfies the condition. When the threshold voltage of the memory cell transistor MT is expected to decrease due to the interruption of the write operation, the row decoder 120 applies VCGVm lower than the verification voltage VCGV in the first verification operation immediately after resumption. Accordingly, the sense amplifier 140 can determine that the memory cell transistor MT whose threshold voltage decreases also passes the verification operation. Therefore, the sequencer 170 can determine that it is not necessary to further increase the threshold voltage of the memory cell transistor MT, in which the threshold voltage thereof increases enough to pass the verification operation immediately before the interruption of the write operation, and the threshold voltage thereof decreases until the verification voltage is executed, in the program operation immediately after resumption. Therefore, it is possible to prevent the threshold voltage of the memory cell transistor MT whose threshold voltage decreases from being excessively increased by the first program operation immediately after resumption. Accordingly, deterioration in the performance of the write operation can be prevented.

When the interrupt operation does not satisfy the condition, the sequencer 170 applies the verification voltage VCGV to the selected word line WL in the first verification operation immediately after resumption. Accordingly, when the interrupt operation is not expected to contribute to the decrease in the threshold voltage of the memory cell transistor MT, it is possible to determine whether or not the threshold voltage of the memory cell transistor MT reaches a desired state by the normal verification voltage VCGV.

5. Modified Example

The above-described first to fourth embodiments can be modified in various ways.

For example, the above-described second embodiment and third embodiment describe a case in which it is determined whether or not to change the amount of increase in the program voltage VPGM from DVPGM1 to another amount of increase (DVPGM2 or 0) based upon whether or not one condition is satisfied, but embodiments are not limited to the case. For example, the amount of increase in the program voltage VPGM may be changed from DVPGM1 to any one of a plurality of amounts of increase based upon a plurality of conditions. Specifically, for example, when the interrupt operation satisfies both the first condition and the second condition, the sequencer 170 may determine that the amount of increase in the program voltage VPGM is changed from DVPGM1 to 0, when the interrupt operation satisfies the first condition and does not satisfy the second condition, the sequencer 170 may determine that the amount of increase in the program voltage VPGM is changed from DVPGM1 to DVPGM2, and when the interrupt operation does not satisfy both the first condition and the second condition, the sequencer 170 may determine that the amount of increase in the program voltage VPGM is not changed from DVPGM1. The same modification as that of the amount of increase in the program voltage VPGM described above can be also applied to the amount of decrease in the verification voltage VCGV in the fourth embodiment. Accordingly, a shape of the threshold voltage distribution can be controlled more accurately according to the degree of decrease in the threshold voltage of the memory cell transistor MT.

In this case, the second condition may be a stricter condition in the first condition. For example, the sequencer 170 may apply "the period D is equal to or longer than the threshold Dth" as the first condition, and may apply "the period D is equal to or longer than the threshold Dth2 (>Dth)" as the second condition. For example, the sequencer 170 may apply "the temperature T is equal to or higher than the threshold Tth" as the first condition, and may apply "the temperature T is equal to or higher than the threshold Tth2 (>Tth)" as the second condition.

The above-described second embodiment describes a case in which the number of times n of program operations in which the amount of increase in the program voltage VGPM after resumption is changed from DVPGM1 to DVPGM2 is predetermined, but embodiments are not limited to the case. For example, the number of times n may be determined stepwise by a plurality of conditions.

For example, when "the period D is equal to or longer than the threshold Dth and shorter than the threshold Dth2 (>Dth)" is satisfied, the sequencer 170 may apply the number of times n1, and when "the period D is equal to or longer than the threshold Dth2" is satisfied, the sequencer 170 may apply the number of times n2 (>n1). For example, when "the temperature T is equal to or higher than the threshold Tth and less than the threshold Tth2 (>Tth)" is satisfied, the sequencer 170 may apply the number of times n1, and when "the temperature T is equal to or higher than the threshold Tth2" is satisfied, the sequencer 170 may apply the number of times n2.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor storage device, comprising:
   a memory cell connected to a word line; and
   a control circuit configured to execute a write operation that repeats a program loop including a program operation of applying a program voltage to the word line and a verification operation of applying a first verify voltage and then a second verify voltage to the word line after the program operation,
   wherein the control circuit is configured to, during the write operation,
   increase the program voltage by a first amount each time the program loop is repeated,
   suspend the write operation during a first period, a second period, and a period other than the first and second periods in a program loop, and then resume the write operation, the first period being from an end of a program operation in the program loop to a beginning of a verification operation in the program loop, the second period being from the beginning of the verification operation in the program loop to an end of the verification operation in the program loop,
   if the write operation has been suspended during the first period, after the write operation is resumed, change the increase in the program voltage from the first amount to a second amount, the second amount being a positive number and smaller than the first amount,
   if the write operation has been suspended during the second period, after the write operation is resumed, change the increase in the program voltage from the first amount to the second amount, and
   if the write operation has been suspended other than the first period and the second period, after the write operation is resumed, maintain the increase in the program voltage to the first amount.

2. The semiconductor storage device according to claim 1, wherein f if the write operation has been suspended during the first period and if the write operation has been suspended during the second period, the control circuit, after the write operation is resumed,
increases the program voltage by the second amount each time the program loop is repeated in the write operation up to n times (where n is an integer greater than 1).

3. The semiconductor storage device according to claim 2, wherein the control circuit determines that the first period is longer than a threshold time period.

4. The semiconductor storage device according to claim 2, wherein if the write operation has been suspended during the first period and the second period, the control circuit, after the write operation is resumed,
increases the program voltage by the second amount in all the program operations of the write operation that are carried out after resuming the write operation.

5. A semiconductor storage device, comprising:
a memory cell connected to a word line; and
a control circuit configured to execute a write operation that repeats a program loop including a program operation of applying a program voltage to the word line and a verification operation of applying a first verify voltage and then a second verify voltage to the word line after the program operation,
wherein the control circuit is configured to, during the write operation,
increase the program voltage by a first amount for each program loop,
suspend the write operation during a first period, a second period, and a period other than the first and second periods in a program loop, and execute a first operation while the write operation is suspended, the first period being from an end of a program operation in the program loop to a beginning of a verification operation in the program loop, the second period being from the beginning of the verification operation in the program loop to an end of the verification operation in the program loop,
resume the write operation, and
if the write operation has been suspended during the first period, after the write operation is resumed, change the increase in the program voltage from the first amount to a second amount smaller than the first amount, when the first operation satisfies a condition,
if the write operation has been suspended during the second period, after the write operation is resumed, change the increase in the program voltage from the first amount to the second amount, when the first operation satisfies the condition, and
if the write operation has been suspended other than the first period and the second period, after the write operation is resumed, maintain the increase in the program voltage to the first amount.

6. The semiconductor storage device according to claim 5, wherein the second amount is 0.

7. The semiconductor storage device according to claim 5, wherein the second amount is a positive number.

8. The semiconductor storage device according to claim 7, wherein if the write operation has been suspended during the first period and the second period, the control circuit, after the write operation is resumed,
increases the program voltage by the second amount in all the program operations of the write operation that are carried out after resuming the write operation.

9. The semiconductor storage device according to claim 5, wherein the control circuit determines that the first period is longer than a threshold time period.

10. The semiconductor storage device according to claim 9, wherein the first operation satisfies the condition, when a number of times of the first operation executed during the first period exceeds a threshold number.

11. The semiconductor storage device according to claim 5, wherein the first operation satisfies the condition, when the first operation is associated with a predetermined command from a memory controller.

12. The semiconductor storage device according to claim 5, wherein the first operation satisfies the condition, when a temperature of the semiconductor storage device during execution of the first operation exceeds a threshold temperature.

13. A method of executing a write operation in a semiconductor storage device including a memory cell connected to a word line, said method comprising:
repeating a program loop including a program operation during which a program voltage is applied to the word line and a verification operation during which a first verify voltage and then a second verify voltage are applied to the word line after the program operation,
the write operation including:
increasing the program voltage by a first amount each time the program loop is repeated,
suspending the write operation during a first period, a second period, or a period other than the first and second periods in a program loop, the first period being from an end of a program operation in the program loop to a beginning of a verification operation in the program loop, the second period being from the beginning of the verification operation in the program loop to an end of the verification operation in the program loop,
resuming the write operation,
if the write operation has been suspended during the first period, after the write operation is resumed, changing the increase in the program voltage from the first amount to a second amount, the second amount being a positive number and smaller than the first amount;
if the write operation has been suspended during the second period, after the write operation is resumed, changing the increase in the program voltage from the first amount to the second amount; and
if the write operation has been suspended other than the first period and the second period, after the write operation is resumed, maintaining the increase in the program voltage to the first amount.

14. The method according to claim 13, wherein if the write operation has been suspended during the first period and the second period, after the write operation is resumed,
the program voltage is increased by the second amount each time the program loop is repeated in the write operation up to n times (where n is an integer greater than 1).

15. The method according to claim 14, further comprising:
determining that the first period is longer than a threshold time period.

16. The method according to claim 14, wherein if the write operation has been suspended during the first period and the second period, after the write operation is resumed, the program voltage is increased by the second amount in all the program operations of the write operation that are carried out after resuming the write operation.

17. The method according to claim 14, further comprising:
determining that a temperature of the semiconductor storage device while the write operation is suspended exceeds a threshold temperature.

\* \* \* \* \*